United States Patent
Noguchi

(10) Patent No.: US 9,041,570 B2
(45) Date of Patent: May 26, 2015

(54) ANALOG-TO-DIGITAL CONVERTER AND ANALOG-TO-DIGITAL CONVERSION METHOD

(75) Inventor: Hidemi Noguchi, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 14/343,975

(22) PCT Filed: Jun. 5, 2012

(86) PCT No.: PCT/JP2012/003675
§ 371 (c)(1),
(2), (4) Date: Mar. 10, 2014

(87) PCT Pub. No.: WO2013/046497
PCT Pub. Date: Apr. 4, 2013

(65) Prior Publication Data
US 2014/0232577 A1    Aug. 21, 2014

(30) Foreign Application Priority Data
Sep. 30, 2011   (JP) .................... 2011-216427

(51) Int. Cl.
| H03M 1/06 | (2006.01) |
| H03M 1/00 | (2006.01) |
| H03M 1/12 | (2006.01) |
| H03M 1/18 | (2006.01) |

(52) U.S. Cl.
CPC .............. *H03M 1/002* (2013.01); *H03M 1/005* (2013.01); *H03M 1/1215* (2013.01); *H03M 1/188* (2013.01)

(58) Field of Classification Search
USPC .................................. 341/155, 118, 139, 159
See application file for complete search history.

(56) References Cited

U.S. PATENT DOCUMENTS

| 7,414,563 | B2* | 8/2008 | Kobayashi ................ 341/158 |
| 7,777,660 | B2* | 8/2010 | Chen et al. ............... 341/155 |
| 8,587,464 | B2* | 11/2013 | Bonaccio et al. ........... 341/155 |
| 8,749,410 | B1* | 6/2014 | Van Der Goes et al. ...... 341/118 |

FOREIGN PATENT DOCUMENTS

| JP | 2009-267808 A | 11/2009 |
| JP | 2010-62995 A | 3/2010 |
| JP | 2011-9960 A | 1/2011 |

OTHER PUBLICATIONS

International Search Report for PCT Application No. PCT/JP2012/003675, mailed on Jul. 10, 2012.

* cited by examiner

Primary Examiner — Brian Young
(74) Attorney, Agent, or Firm — Sughrue Mion, PLLC

(57) ABSTRACT

An analog-to-digital converter according to the present invention includes first and second analog-to-digital conversion cells (11, 12), control means (10) for, when a mode specifying signal MD indicates a first mode, generating a control signal that sets first and second input ranges to the same voltage range and sets first and second clocks to different phases, and when the mode specifying signal MD indicates a second mode, generating the control signal that sets the first and second input ranges to one continuous voltage range and sets the first and second clocks to the same phase, ADC cell control means (111) for controlling the voltage ranges of the first and second input ranges according to the control signal, and a sampling clock generation unit (112) that generates the first and second sampling clocks according to the control signal.

17 Claims, 31 Drawing Sheets

| MD | VREF11+ | VREF11- | VREF12+ | VREF12- | CLK11 | CLK12 | OUTPAT |
|---|---|---|---|---|---|---|---|
| 0 | VDD | GND | VDD | GND | 0deg | -180deg | THR |
| 1 | VDD | VDD/2 | VDD/2 | GND | 0deg | 0deg | MRG1 |

| MD | VREF11+ | VREF11- | VREF12+ | VREF12- | VREF13+ | VREF13- | VREF14+ | VREF14- | CLK11 | CLK12 | CLK13 | CLK14 | OUTPAT |
|---|---|---|---|---|---|---|---|---|---|---|---|---|---|
| 00 | VDD | GND | VDD | GND | VDD | GND | VDD | GND | 0deg | -90deg | -180deg | -270deg | THR |
| 01 | VDD | 3VDD/4 | 3VDD/4 | VDD/2 | VDD/2 | VDD/4 | VDD/4 | GND | 0deg | 0deg | 0deg | 0deg | MRG1 |
| 10 | VDD | VDD/2 | VDD/2 | GND | VDD | VDD/2 | VDD/2 | GND | 0deg | 0deg | -180deg | -180deg | MRG2 |

Fig. 7

| MD | AC11–AC14 | SFT11 | SFT12 | SFT13 | SFT4 | VREF+ | VREF− | CLK11 | CLK12 | CLK13 | CLK14 | OUTPAT |
|---|---|---|---|---|---|---|---|---|---|---|---|---|
| 0 | 0dB | 0 | 0 | 0 | 0 | VDD | GND | 0deg | −90deg | −180deg | −270deg | THR |
| 1 | 0dB | −3VDD/4 (−3LS) | −VDD/2 (−2LS) | −VDD/4 (−LS) | 0 | VDD/4 | GND | 0deg | 0deg | 0deg | 0deg | MRG1 |

Fig. 14

| VREF11+ | VREF11− | VREF12+ | VREF12− | VREF13+ | VREF13− | VREF14+ | VREF14− | CLK11 | CLK12 | CLK13 | CLK14 |
| VDD | 3VDD/4 | 3VDD/4 | VDD/2 | VDD/2 | VDD/4 | VDD/4 | GND | 0deg | 0deg | 0deg | 0deg |
| VREF21+ | VREF21− | VREF22+ | VREF22− | VREF23+ | VREF23− | VREF24+ | VREF24− | CLK21 | CLK22 | CLK23 | CLK24 |
| VDD | 3VDD/4 | 3VDD/4 | VDD/2 | VDD/2 | VDD/4 | VDD/4 | GND | −90deg | −90deg | −90deg | −90deg |
| VREF31+ | VREF31− | VREF32+ | VREF32− | VREF33+ | VREF33− | VREF34+ | VREF34− | CLK31 | CLK32 | CLK33 | CLK34 |
| VDD | 3VDD/4 | 3VDD/4 | VDD/2 | VDD/2 | VDD/4 | VDD/4 | GND | −180deg | −180deg | −180deg | −180deg |
| VREF41+ | VREF41− | VREF42+ | VREF42− | VREF43+ | VREF43− | VREF44+ | VREF44− | CLK41 | CLK42 | CLK43 | CLK44 |
| VDD | 3VDD/4 | 3VDD/4 | VDD/2 | VDD/2 | VDD/4 | VDD/4 | GND | −270deg | −270deg | −270deg | −270deg |

Fig. 21

| VREF11+ | VREF11- | VREF12+ | VREF12- | VREF13+ | VREF13- | VREF14+ | VREF14- | CLK11 | CLK12 | CLK13 | CLK14 |
|---|---|---|---|---|---|---|---|---|---|---|---|
| VDD | VDD/2 | VDD/2 | GND | - | - | - | - | 0deg | 0deg | - | - |
| VREF21+ | VREF21- | VREF22+ | VREF22- | VREF23+ | VREF23- | VREF24+ | VREF24- | CLK21 | CLK22 | CLK23 | CLK24 |
| - | - | - | - | - | - | - | - | - | - | - | - |
| VREF31+ | VREF31- | VREF32+ | VREF32- | VREF33+ | VREF33- | VREF34+ | VREF34- | CLK31 | CLK32 | CLK33 | CLK34 |
| VDD | VDD/2 | VDD/2 | GND | - | - | - | - | -180deg | -180deg | - | - |
| VREF41+ | VREF41- | VREF42+ | VREF42- | VREF43+ | VREF43- | VREF44+ | VREF44- | CLK41 | CLK42 | CLK43 | CLK44 |
| - | - | - | - | - | - | - | - | - | - | - | - |

Fig. 23

| | MINIMUM QUANTIZATION STEP VOLTAGE (1LSB) | VREF11+ | VREF11- | VREF12+ | VREF12- | VREF13+ | VREF13- | VREF14+ | VREF14- |
|---|---|---|---|---|---|---|---|---|---|
| FIRST MODIFIED EXAMPLE (FIG. 13) | VDD/32 | VDD | GND | VDD-LSB | GND-LSB | VDD-2LSB | GND-2LSB | VDD-3LSB | GND-3LSB |
| SECOND MODIFIED EXAMPLE (FIG. 14) | VDD/32 | VDD+LSB | VDD-15LSB | VDD | VDD/2 | VDD/2 | GND | GND+15LSB | GND-LSB |
| THIRD MODIFIED EXAMPLE (FIG. 15) | VDD/48 | VDD | 2VDD/3 | 2VDD/3 | VDD/2 | VDD/2 | VDD/3 | VDD/3 | GND |
| FOURTH MODIFIED EXAMPLE (FIG. 16) | VDD/25 | VDD | GND+9LSB | VDD-9LSB | GND | VDD | GND+9LSB | VDD-9LSB | GND |
| FIFTH MODIFIED EXAMPLE (FIG. 17) | VDD/48 | VDD | VDD-16LSB | VDD-9LSB | GND+23LSB | VDD-23LSB | GND+9LSB | GND+16LSB | GND |

Fig. 25

| VREF11+ | VREF11− | VREF12+ | VREF12− | VREF13+ | VREF13− | VREF14+ | VREF14− | CLK11 | CLK12 | CLK13 | CLK14 |
|---|---|---|---|---|---|---|---|---|---|---|---|
| VDD | GND | VDD | GND | VDD | GND | VDD | GND | 0deg | −90deg | −135deg | −315deg |

Fig. 31

ANALOG-TO-DIGITAL CONVERTER AND ANALOG-TO-DIGITAL CONVERSION METHOD

This application is a National Stage Entry of PCT/JP2012/003675 filed Jun. 5, 2012, which claims priority from Japanese Patent Application 2011-216427 filed Sep. 30, 2011, the contents of all of which are incorporated herein by reference, in their entirety.

TECHNICAL FIELD

The present invention relates to an analog-to-digital converter and an analog-to-digital conversion method for converting an input analog signal into a digital signal.

BACKGROUND ART

The analog-to-digital converter (hereinafter referred to as an ADC as appropriate) is used in various fields. The required conversion speed and quantization bit rate of the ADC differ from system to system to which the ADC is applied. For example, in the ADC used for a communication purpose, as a signal band and a required SNR (Signal to Noise Ratio) differ depending on the communication scheme, the conversion speed and quantization bit rate required for the ADC also differ from communication scheme to communication scheme. Note that if the input range stays the same, the greater the quantization bit rate, the higher the conversion accuracy (SNR) of the ADC. That is, the conversion accuracy of the ADC is an index that depends on the size of the quantization bit width.

Here, FIG. 34 shows an example of a relationship between the conversion speed and conversion accuracy required for the ADC. FIG. 34 shows a relationship between signal bands of three modulation schemes, which are BPSK (Binary Phase-Shift Keying), QPSK (Quaternary Phase-Shift Keying), and 16PSK (16 Phase-Shift Keying), and SNRs that are required for the respective communication schemes. In BPSK, the required signal band is wide but the required SNR can be low. Therefore, an ADC with a high conversion speed and a low SNR is used for BPSK. Meanwhile, in 16PSK, the required signal band is narrow but the required SNR is high. Therefore, an ADC capable of achieving a high SNR is used for 16PSK even if a conversion speed thereof is low. Similarly, in QPSK, an ADC with a conversion speed between the conversion speeds required for BPSK and 16PSK and an SNR between the SNRs required for BPSK and 16PSK is used. As stated above, the performance required for the ADC differs from modulation scheme to modulation scheme. Thus, systems have heretofore been built using ADCs dedicated for the respective modulation schemes.

However, there has been a problem that the development cost and capital investment increase when different systems are used for different modulation schemes. In order to solve this problem, it is necessary to realize a highly flexible system that supports a plurality of requirement specifications. However, in order to realize a highly flexible system using a known ADC with a fixed conversion speed and conversion accuracy, an ADC with performance realizing a high conversion speed and high conversion accuracy at the same time is necessary. However, it is extremely difficult to realize such a high-speed and highly accurate ADC for a communication purpose in which the speed has been further accelerated in recent years. Even if such an ADC can be realized, the accuracy and the speed may be excessively or unnecessarily high for a certain modulation scheme, thereby leading to a problem of inefficiency and larger power consumption.

As a way to solve this problem, related art has already been suggested such as that disclosed in Patent Literature 1. The ADC of Patent Literature 1 uses a plurality of basic ADCs having the same performance. The ADC of Patent Literature 1 includes a time-interleaved configuration that operates the plurality of basic ADCs at different timings in the time-axis direction to thereby improve an apparent conversion speed. Moreover, the ADC of Patent Literature 1 includes an output average configuration that operates the plurality of basic ADCs at the same timing and averages outputs thereof to thereby reduce a random noise component other than quantization noise and improve the conversion accuracy. Further, the ADC of Patent Literature 1 arbitrarily combines the time-interleaved configuration and the output average configuration and flexibly switches the conversion speed and the conversion accuracy. However, the ADC of Patent Literature 1 uses averaging processing as a way to improve the conversion accuracy. Accordingly, even if the random noise component can be reduced, the quantization noise cannot be eliminated. It is therefore not possible to so improve the conversion accuracy that a quantization bit rate greater than or equal to the quantization bit rate of the basic ADC is achieved.

Meanwhile, as a similar approach, a related technique disclosed in Patent Literature 2 is a method for realizing an ADC having a quantization bit rate greater than or equal to the quantization bit rate of the basic ADC. In the ADC disclosed in Patent Literature 2, a plurality of basic ADCs are used to vary or shift a reference voltage that determines the quantization threshold of the ADC, thereby realizing an ADC having the quantization bit rate greater than or equal to the quantization bit rate of the basic ADCs. The configuration that realizes the ADC having the quantization bit rate greater than or equal to the quantization bit rate of the basic ADCs by varying or shifting the reference voltage that determines the quantization threshold of the ADC in a manner explained above shall be hereinafter referred to as an amplitude-interleaved configuration. However, the amplitude-interleaved configuration disclosed in Patent Literature 2 only improves the accuracy in the amplitude direction, while it is unable to achieve a conversion speed greater than or equal to the basic ADCs.

CITATION LIST

Patent Literature

Patent Literature 1: Japanese Unexamined Patent Application Publication No. 2011-009960
Patent Literature 2 Japanese Unexamined Patent Application Publication No. 2009-267808

SUMMARY OF INVENTION

Technical Problem

As explained above, there is a problem in Patent Literatures 1 and 2 that only one of a high conversion speed and high conversion accuracy is realized, and the two of them cannot be achieved at the same time. It may be considered possible to realize a high conversion speed and high conversion accuracy by combining the time-interleaved configuration of Patent Literature 1 and the amplitude-interleaved configuration of Patent Literature 2. However, a problem is that an ADC with a combination of those configurations has an excessive performance for the capacity required for conversion processing, and the power consumption thus becomes excessively large. For example, in performing the conversion processing on a signal of the 16PSK communication scheme shown in FIG. 34, a high conversion speed is unnecessary, and thus a difference between a conversion cycle necessary for the conversion processing and an actual conversion cycle will be conversion processing not actually required, thereby consuming excessive power. Moreover, in performing the conversion processing on a signal of the BPSK communication scheme shown in FIG. 34, high conversion accuracy is unnecessary, and thus ADCs corresponding to a difference between the number of ADCs (quantization bit rate) necessary for the conversion processing and the number of ADCs used in the actual conversion processing will be conversion processing not actually required, thereby consuming excessive power.

In light of the above problem, an object of the present invention is to realize an analog-to-digital converter that supports conversion processing of signals in more communication schemes while suppressing power consumption.

Solution to Problem

An exemplary aspect of the present invention is an analog-to-digital converter that includes: a first analog-to-digital conversion cell that quantizes a voltage level of an analog signal within a first quantization range at a first quantization step and outputs a first digital value; a second analog-to-digital conversion cell that quantizes the voltage level of the analog signal within a second input range at a second quantization step and outputs a second digital value; control means for, when a mode specifying signal indicates a first mode, generating a control signal that sets the first and second input ranges to the same voltage range and sets first and second sampling clocks to different phases, and when the mode specifying signal indicates a second mode, generating the control signal that sets the first and second input ranges to one continuous voltage range and sets the first and second sampling clocks to the same phase; ADC cell control means for controlling the voltage ranges of the first and second input ranges according to the control signal; sampling clock generation means for supplying the first and second sampling clocks to the first and second analog-to-digital conversion cells, respectively, according to the control signal; and an output data processing circuit that merges the first and second digital values and outputs output data.

Another exemplary aspect of the present invention is a method for analog-to-digital conversion, the method comprising steps of: quantizing a voltage level of an analog signal within a first input range at a first quantization step and outputting a first digital value; quantizing the voltage level of the analog signal within a second input range at a second quantization step and outputting a second digital value; when a mode specifying signal indicates a first mode, using a first analog-to-digital conversion cell having a first input range and a second analog-to-digital conversion cell having a second input range, setting the first and second input ranges to the same voltage range, quantizing the voltage level of the analog signal, and outputting the first digital value and the second digital value at different sampling timings; when the mode specifying signal indicates a second mode, using the first analog-to-digital conversion cell and the second analog-to-digital conversion cell, setting the first and second input ranges to one continuous voltage range, and outputting the first digital value and the second digital value at the same sampling timing; and merging the first and second digital values and outputting output data.

Advantageous Effects of Invention

The analog-to-digital converter and the analog-to-digital conversion method according to the present invention provide an analog-to-digital converter that supports conversion processing of signals in more communication schemes while suppressing the power consumption.

BRIEF DESCRIPTION OF DRAWINGS

FIG. 7 is a diagram showing an example of a configuration table of an analog-to-digital converter according to the second exemplary embodiment;

FIG. 14 is a diagram showing an example of a configuration table of the analog-to-digital converter according to the third exemplary embodiment;

FIG. 21 is a diagram showing an example of a configuration table of the analog-to-digital converter according to the fifth exemplary embodiment;

FIG. 23 is a diagram showing another example of the configuration table of the analog-to-digital converter according to the fifth exemplary embodiment;

FIG. 25 is a diagram showing a modified example of the configuration table of the analog-to-digital converter according to the present invention;

FIG. 31 is a diagram showing an example of a configuration table corresponding to an operation mode that performs conversion processing at unequal sampling timings;

DESCRIPTION OF EMBODIMENTS

Firstly, the terms used in this specification shall be defined. Generally, the term "resolution" is used as an index to indicate the performance of an ADC. The term "resolution" may indicate the number of stages of a digital value obtained by resolving an analog input voltage, i.e., the number of bits of a digital value obtained by converting an analog input voltage, or may indicate a range of analog input voltages which will be converted into the same digital value, i.e., an analog voltage width that can be resolved. In this specification, as it is necessary to distinguish between the resolution having the former meaning and the resolution having the latter meaning, the resolution having the former meaning shall be referred to as "the number of quantization steps", and the resolution having the latter meaning shall be referred to as a "quantization step voltage". For example, in the case of a normal two-bit ADC that has a range of an analog input voltage of 3 V and performs linear conversion, the number of quantization steps will be four, and the quantization step voltage will be 1 V. Note that the "quantization step voltage" does not necessarily need to be constant through the entire analog input voltage range.

Further, in general, an input voltage range of an ADC is smaller than a voltage difference between a power supply voltage VDD which will be supplied to the ADC and a ground voltage GND. However in the present invention, in order to simplify the explanation, a maximum value of the input voltage range of an ADC shall be the power supply voltage VDD, and a minimum value thereof shall be the ground voltage GND.

First Exemplary Embodiment

Figures 1, 2:
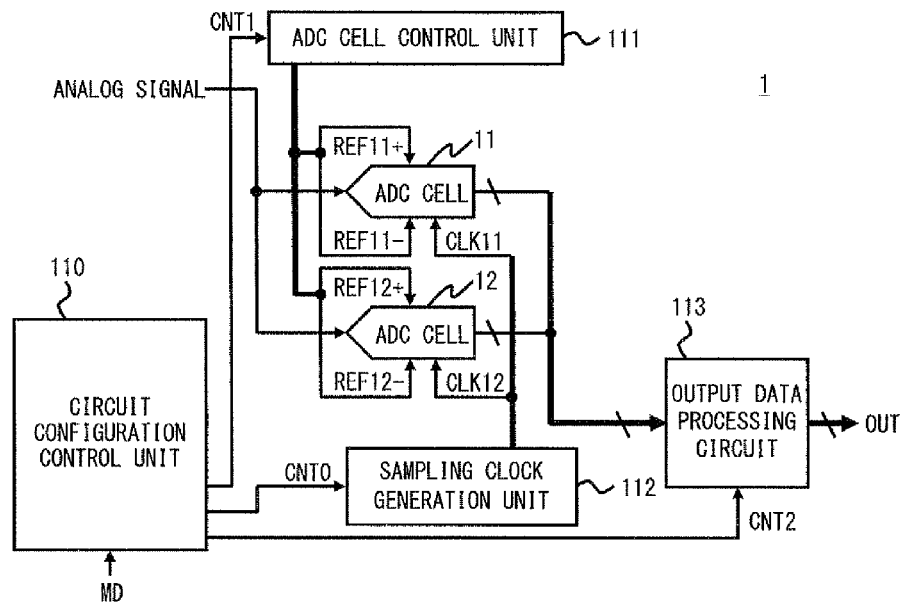
FIG. 1 is a block diagram of an analog-to-digital converter according to a first exemplary embodiment.
FIG. 2 is a diagram showing an example of a configuration table of the analog-to-digital converter according to the first exemplary embodiment.

Hereinafter, exemplary embodiments of the present invention shall be explained with reference to the drawings. FIG. 1 is a block diagram of an entire analog-to-digital converter 1 of the present invention. As shown in FIG. 1, the analog-to-digital converter 1 according to the first exemplary embodiment includes analog-to-digital conversion cells (hereinafter referred to as ADC cells) 11 and 12, a circuit configuration control unit 110, an ADC cell control unit 111, a sampling clock generation unit 112, and an output data processing circuit 113.

Note that the first exemplary embodiment explains an example in which the analog-to-digital converter 1 has, as operation modes, a first mode for performing high-speed and low accuracy conversion processing and a second mode for performing low-speed and high accuracy conversion processing. Moreover, in the following explanation, conversion accuracy indicates the size of the quantization step voltage. That is, a small quantization step voltage is a state of high conversion accuracy, whereas a large quantization step voltage is a state of low conversion accuracy. Further, in the following explanation, a conversion speed indicates the level of a sampling frequency of the ADC cell.

The ADC cell 11 is a block corresponding to a first analog-to-digital conversion cell. The ADC cell 11 quantizes a voltage level of an analog signal within a first input range at a first quantization step and outputs a first digital value. The ADC cell 12 is a block corresponding to a second analog-to-digital conversion cell. The ADC cell 12 quantizes a voltage level of an analog signal within a second input range in a second quantization step and outputs a second digital value. Note that as for the analog-to-digital converter 1 according to the first exemplary embodiment, an example in which the ADC cell 11 and the ADC cell 12 have the same number of quantization steps is described.

In response to a mode specifying signal MD, the circuit configuration control unit 110 supplies control signals CNT0, CNT1, and CNT2 to the sampling clock generation unit 112, the ADC cell control unit 111, and the output data processing circuit 113, respectively. The control signals CNT0, CNT1, and CNT2 specify an input voltage range and a sampling timing of the ADC cells 11 and 12, respectively, for the respective sampling clock generation unit 112 and the ADC cell control unit 111. Moreover, the control signal CNT2 specifies a processing method of conversion results by the ADC cells 11 and 12 for the output data processing circuit 113.

Associations between the control signals CNT0, CNT1, and CNT2 and the mode specifying signal MD may be defined in, for example, a configuration table or the like that is included in the circuit configuration control unit 110. Then, information in the configuration table may be selected according to the mode specifying signal MD, and the control signals CNT0, CNT1, and CNT2 may be output.

The ADC cell control unit 111 controls voltage ranges of the first and second input ranges. More specifically, the ADC cell control unit 111 outputs a first maximum reference voltage REF11+ that sets a maximum value of the input range of the ADC cell 11 (e.g., the first input range), a minimum reference voltage REF11− that sets a minimum value of the first input voltage, a second maximum reference voltage REF12+ that sets a maximum value of the input range of the ADC cell 12 (e.g., the second input range), and a minimum reference voltage REF12− that sets a minimum value of the second input voltage. Then, the ADC cell control unit 111 switches the voltage values of the first and second maximum reference voltages and the first and second minimum reference voltages according to the control signal CNT0 output by the circuit configuration control unit 110. Note that in the following explanation, the first maximum reference voltage shall be referred to as the maximum reference voltage REF11+, the second maximum reference voltage shall be referred to as the maximum reference voltage REF12+, the first minimum reference voltage shall be referred to as the minimum reference voltage REF11−, and the second minimum reference voltage shall be referred to as the minimum reference voltage REF12−.

The sampling clock generation unit 112 supplies a first sampling clock CLK11 and a second sampling clock CLK12 respectively to the ADC cells 11 and 12 according to the control signal CNT1. The ADC cell 11 performs sampling processing in synchronization with, for example, a rising edge of the supplied sampling clock.

The output data processing circuit 113 generates output data using output values output from the plurality of ADC cells. To be more specific, when the mode specifying signal MD indicates a first mode, the control signal CNT2 that is output according to the first mode is input to the output data processing circuit 113. When the control signal CNT2 corresponding to the first mode is input, the output data processing circuit 113 outputs a first digital value output by the ADC cell 11 and a second digital value output by the ADC cell 12 as output data. Note that the first digital value and the second digital value correspond to input voltages sampled at different timings.

Meanwhile, when the mode specifying signal MD indicates the second mode, the control signal CNT2 that is output according to the second mode is input to the output data processing circuit 113. When the control signal CNT2 corresponding to the second mode is input, the output data processing circuit 113 converts the first digital value output by the ADC cell 11 and the second digital value output by the ADC cell 12 in accordance with a predetermined rule and outputs the converted values as the output data.

An association between the first digital value and the second digital value and the output data may be defined in a conversion table or the like in advance. Then, the first digital value and the second digital value may be merged according to the definition in the conversion table, and the merged value may be output as the output data.

Here, details of the configuration definition table shall be explained. In the analog-to-digital converter 1 according to the first exemplary embodiment, when the mode specifying signal MD indicates the first mode, high-speed and low accuracy conversion processing is performed, whereas when the mode specifying signal indicates the second mode, low-speed and high accuracy conversion processing is performed. Thus, in the analog-to-digital converter 1 according to the first exemplary embodiment, two circuit configuration values are included in the configuration definition table. The circuit configuration values here are reflected to the control signals CNT0, CNT1, and CNT2 and input to the sampling clock generation unit 112, the conversion range control unit 111, and the output data processing circuit 113. FIG. 2 shows an example of the configuration definition table according to the first exemplary embodiment.

As shown in FIG. 2, the configuration definition table according to the first exemplary embodiment holds values set in the manner shown below as the circuit configuration values when the mode specifying signal MD indicates the first mode (e.g., when the value of the mode specifying signal MD is 0). That is, the maximum reference voltages VREF11+ and VREF12+ are both set to the power supply voltage VDD, and the minimum reference voltages REF11− and REF12− are both set to the ground voltage GND. A phase setting value of the first sampling clock CLK11 is set to 0 deg, and a phase setting value of the second sampling clock CLK12 is set to −180 deg. In conversion to the output data, the configuration table has a value that selects an output conversion table THR for defining the first and second digital values to be output as they are.

Moreover, as shown in FIG. 2, the configuration definition table according to the first exemplary embodiment holds values set in the manner shown below as the circuit configuration values when the mode specifying signal MD indicates the second mode (e.g., when the value of the mode specifying signal MD is 1). That is, the maximum reference voltage VREF11+ is set to the power supply voltage, the minimum reference voltage VREF11− and the maximum reference voltage VREF12+ are both set to half of the power supply voltage (VDD/2), and the minimum reference voltage REF12− is set to the ground voltage GND. The phase setting values of the first sampling clock CLK11 and the second sampling clock CLK12 are set to 0 deg. In conversion to the output data, the configuration table has a value that selects an output conversion table MRG1 for defining the first and second digital values to be merged and output.

That is, when the mode specifying signal MD indicates the first mode, the circuit configuration control unit 110 according to the first exemplary embodiment outputs the circuit configuration values that set the first and second input ranges to the same voltage range and the first sampling clock CLK11 and the second sampling clock CLK12 to different phases. Meanwhile, when the mode specifying signal MD indicates the second mode, the circuit configuration control unit 110 outputs the circuit configuration values that set the first and second input ranges to one continuous voltage range and the first sampling clock CLK11 and the second sampling clock CLK12 to the same phase.

Figure 3:
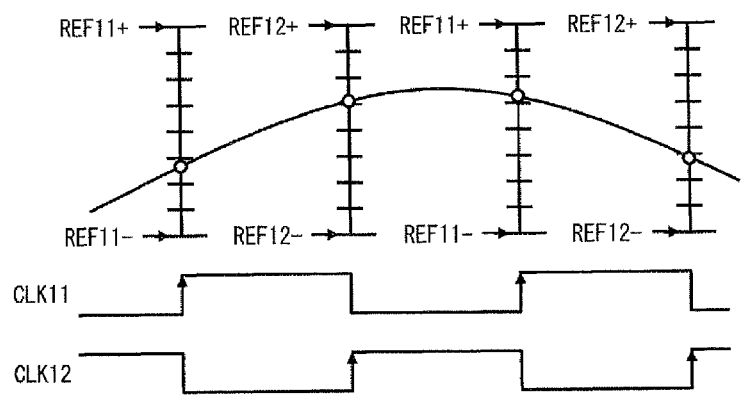
FIG. 3 is a timing chart showing an operation in a first mode of the analog-to-digital converter according to the first exemplary embodiment.

Next, an operation of the analog-to-digital converter 1 according to the first exemplary embodiment shall be explained. FIG. 3 is a timing chart showing an operation in the first mode of the analog-to-digital converter 1. As shown in FIG. 3, in the first mode of the analog-to-digital converter 1, the ADC cell 11 and the ADC cell 12 perform a sampling operation alternately. Moreover, the input ranges of the ADC cell 11 and the ADC cell 12 have the same voltage range. Thus, in the analog-to-digital converter 1 according to the first exemplary embodiment, the conversion processing can be performed at twice the conversion speed that can be achieved by one ADC cell. That is, in the first mode, the analog-to-digital converter 1 realizes an improvement in the conversion speed by the time-interleaved configuration composed of the ADC cells 11 and 12.

Figure 4:
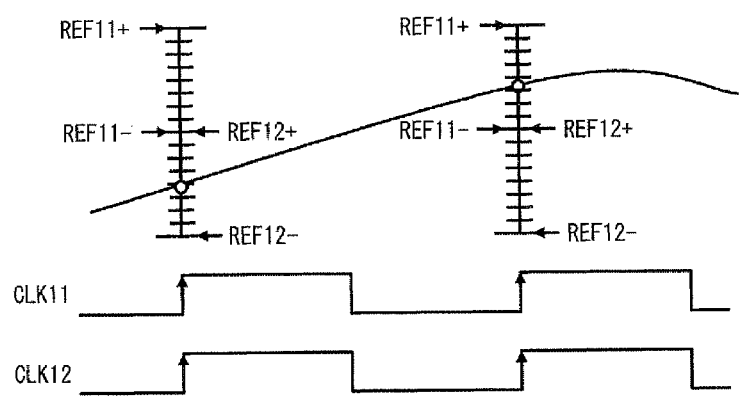
FIG. 4 is a timing chart showing an operation in a second mode of the analog-to-digital converter according to the first exemplary embodiment.

Moreover, FIG. 4 is a timing chart showing an operation in the second mode of the analog-to-digital converter 1. As shown in FIG. 4, in the second mode of the analog-to-digital converter 1, the ADC cells 11 and ADC cell 12 perform the conversion processing at the same sampling timings. Next, the input range of the ADC cell 11 and the input range of the ADC cell 12 are joined to achieve one input range. Accordingly, the analog-to-digital converter 1 can realize analog-to-digital conversion with conversion accuracy which is twice that of one ADC cell, i.e., with a quantization step voltage which is half of that of one ADC cell. That is, in the second mode, the analog-to-digital converter 1 improves the conversion accuracy by the amplitude-interleaved configuration composed of the ADC cells 11 and 12.

Figure 5:
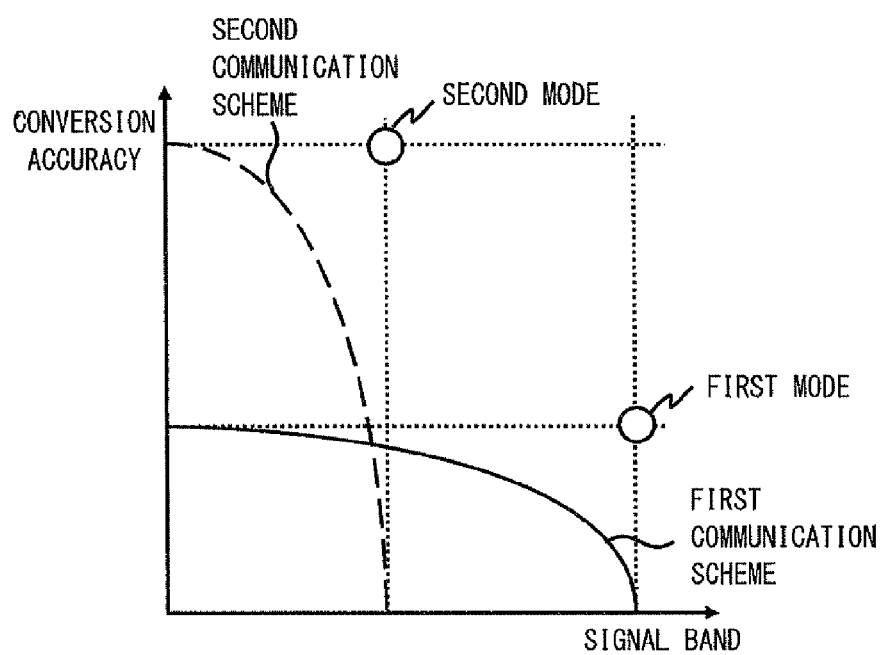
FIG. 5 is a graph showing a relationship between a signal band and conversion accuracy handled by the analog-to-digital converter according to the first exemplary embodiment.

FIG. 5 is a graph showing a relationship between a communication scheme that can be supported by the first mode shown in FIG. 3 and a communication scheme that can be supported by the second mode shown in FIG. 4. The analog-to-digital converter 1 according to the first exemplary embodiment supports a high conversion speed by the time-interleaved configuration composed of the ADC cells 11 and 12 in the first mode. However, in the first mode, only one ADC cell operates in one sampling operation, and the conversion accuracy is thus low. By such an operation, the analog-to-digital converter 1 operating in the first mode can support a first communication scheme that requires a wide signal band and low conversion accuracy shown in FIG. 5.

Moreover, the analog-to-digital converter 1 according to the first exemplary embodiment supports high conversion accuracy by the amplitude-interleaved configuration composed of the ADC cells 11 and 12 in the second mode. However, in the second mode, the sampling speed is limited to the conversion speed of one ADC cell, and the conversion speed is thus low. By such an operation, the analog-to-digital converter 1 operating in the second mode can support a second communication scheme that requires a narrow signal band and high conversion accuracy shown in FIG. 5.

As described above, in the analog-to-digital converter 1 according to the first exemplary embodiment, the ADC cell control unit 111 switches the input ranges of the ADC cells 11 and 12 based on the circuit configuration values selected by the circuit configuration control unit 110 according to the mode specifying signal MD, and the sampling clock generation unit 112 switches the sampling timings of the ADC cells 11 and 12. Accordingly, the analog-to-digital converter 1 according to the first exemplary embodiment can support two communication schemes that require different performance, which are the first communication scheme that requires high-speed and low accuracy conversion processing and the second communication scheme that requires low-speed and high accuracy conversion processing.

Here, the analog-to-digital converter 1 according to the first exemplary embodiment performs, by only the ADC cells 11 and 12, the conversion processing for the two communication schemes that require different performances. In other words, in the analog-to-digital converter 1 according to the first exemplary embodiment, there is no ADC cell that is not used for the conversion processing while either of the two communication schemes that require different performances is being processed. Thus, the analog-to-digital converter 1 according to the first exemplary embodiment will not supply power to a circuit that does not operate in the conversion processing of either of the communication schemes. That is, by using the analog-to-digital converter 1 according to the first exemplary embodiment, it is possible to reduce the power consumption while supporting a plurality of communication schemes that require different performances.

Further, in the analog-to-digital converter 1 according to the first exemplary embodiment, there is no circuit that does not operate while signals in either of the communication schemes are being input. The usage efficiency of the circuits is thus high, and the size of the circuit can be reduced more than the size of the analog-to-digital converter that is configured using a related technique and supports a plurality of communication schemes can be reduced.

Second Exemplary Embodiment

Figure 6:
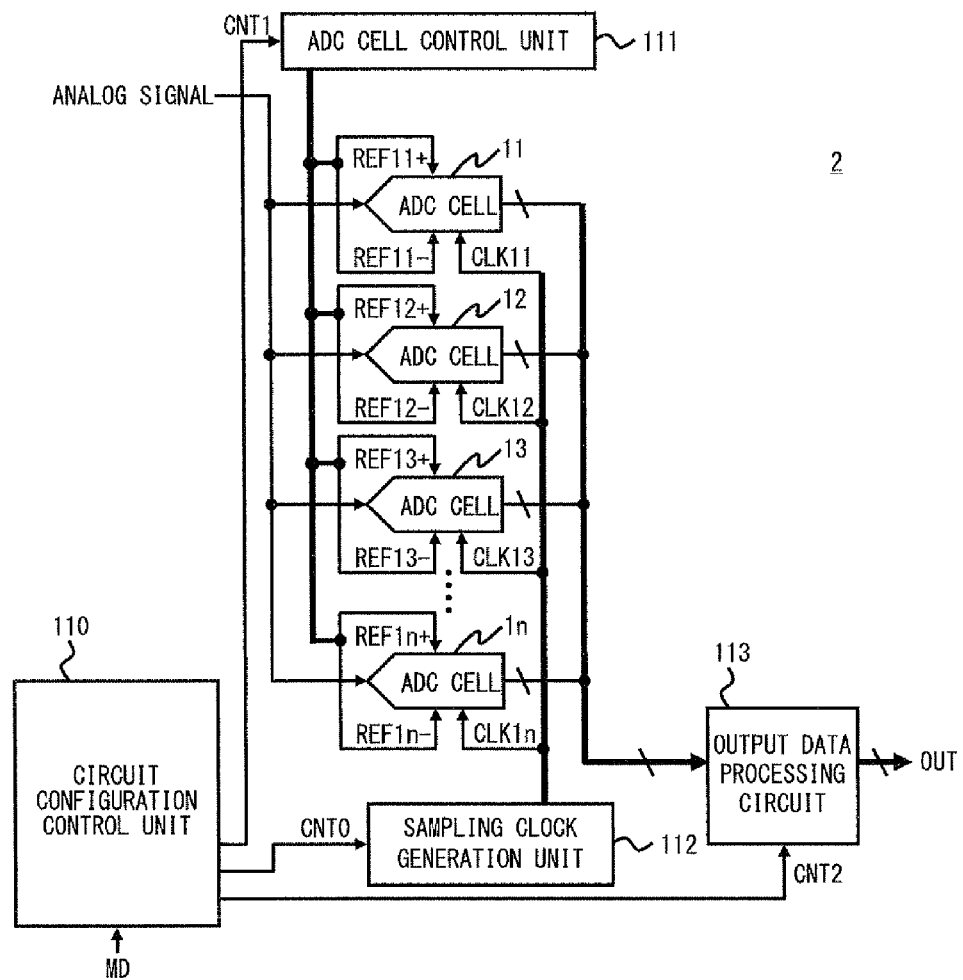
FIG. 6 is a block diagram of an analog-to-digital converter according to a second exemplary embodiment.

FIG. 6 is a block diagram of an analog-to-digital converter 2 according to a second exemplary embodiment. As shown in FIG. 6, an analog-to-digital converter 2 according to the second exemplary embodiment increases the number of ADC cells in the analog-to-digital converter 1 according to the first exemplary embodiment to three or more. In the example shown in FIG. 6, n (n is an integer indicating the number of ADC cells) ADC cells are shown.

In the analog-to-digital converter 2 according to the second exemplary embodiment, it is possible to support more communication schemes than are supported by the analog-to-digital converter 1 according to the first exemplary embodiment by including more ADC cells than are in the analog-to-digital converter 1. Therefore, in the second exemplary embodiment, a configuration table that defines usage of the ADC cells 11 to 1n shall be explained in detail. Note that basic functions of the blocks in the analog-to-digital converter 2 according to the second exemplary embodiment are the same as those explained in the first exemplary embodiment. Thus, a detailed explanation of said functions shall be omitted in the second exemplary embodiment.

FIG. 7 shows an example of the configuration table used by the analog-to-digital converter 2 according to the second exemplary embodiment. In the example shown in FIG. 7, the number of ADC cells is four. That is, the example shown in FIG. 7 corresponds to the case in which the analog-to-digital converter 2 includes the ADC cell 11 (e.g., the first analog-to-digital conversion cell), the ADC cell 12 (e.g., the second analog-to-digital conversion cell), an ADC cell 13 (e.g., a third analog-to-digital conversion cell), and an ADC cell 14 (e.g., a fourth analog-to-digital conversion cell). Note that the third analog-to-digital conversion cell quantizes a voltage level of an analog signal within a third input range at a third quantization step and outputs a third digital value. The fourth analog-to-digital conversion cell quantizes a voltage level of an analog signal within a fourth input range at a fourth quantization step and outputs a fourth digital value.

Moreover, in the analog-to-digital converter 2 corresponding to the example shown in FIG. 7, the sampling clock generation unit 112 outputs a third sampling clock CLK13 and a fourth sampling clock CLK14 which will be supplied to the third and fourth analog-to-digital conversion cells, respectively.

In the example shown in FIG. 7, circuit configuration values related to three operation modes are defined. When the value of the mode specifying signal MD is 00, the circuit configuration control unit 110 outputs the circuit configuration values corresponding to a first operation mode. When the value of the mode specifying signal MD is 01, the circuit configuration control unit 110 outputs the circuit configuration values corresponding to a second operation mode. When the value of the mode specifying signal MD is 10, the circuit configuration control unit 110 outputs the circuit configuration values corresponding to a third operation mode.

The circuit configuration values corresponding to the first mode specify maximum reference voltages and minimum reference voltages so that the input ranges of the ADC cells 11 to 14 will be the same voltage, specify the first sampling clock CLK11 to the fourth sampling clock CLK14 having phases different by 90 deg, and specify a value that selects the output conversion table THR for outputting the first and second digital values as they are as an output pattern. That is, in the analog-to-digital converter 2 corresponding to the example shown in FIG. 7, in the first mode, the first to fourth input ranges are set to the same voltage range, and further, the first to fourth sampling clocks CLK11 to CLK14 are set to different phases.

The circuit configuration values corresponding to the second mode specify maximum reference voltages and minimum reference voltages so that the input ranges of the ADC cells 11 to 14 will be one continuous input range, specify the first sampling clock CLK1 to the fourth sampling clock CLK14 having the same phase, and specify a value that selects the output conversion table MRG1 that merges and outputs the first and second digital values as an output pattern. That is, in the analog-to-digital converter 2 corresponding to the example shown in FIG. 7, in the second mode, the first to fourth input ranges are set to one continuous voltage range, and the first to fourth sampling clocks CLK11 to CLK14 are set to the same phase.

The circuit configuration values corresponding to the fifth mode specify the maximum reference voltages and the minimum reference voltages so that the input ranges of the ADC cells 11 and 12 will be the same continuous input range and the input ranges of the ADC cells 13 and 14 will be the same continuous input range. As for the sampling clocks, a first sampling clock group including the first and second sampling clocks having the same phase and a second sampling clock group including the third and fourth sampling clocks having another same phase are specified. As for conversion to output data, an output conversion table MRG2 that merges and outputs the first digital value and the second digital value and merges and outputs the third digital value and the fourth digital value is specified. That is, in the fifth mode of the analog-to-digital converter 2 corresponding to the example shown in FIG. 7, the first and second input ranges and the third and fourth input ranges are set as continuous common voltage ranges, respectively. Thus, the phases of the first sampling clock group including the first and second sampling clocks CLK11 and CLK12 having the same phase are different from the second sampling clock group including the third and fourth sampling clocks CLK13 and CLK14 having another same phase.

Figure 8:
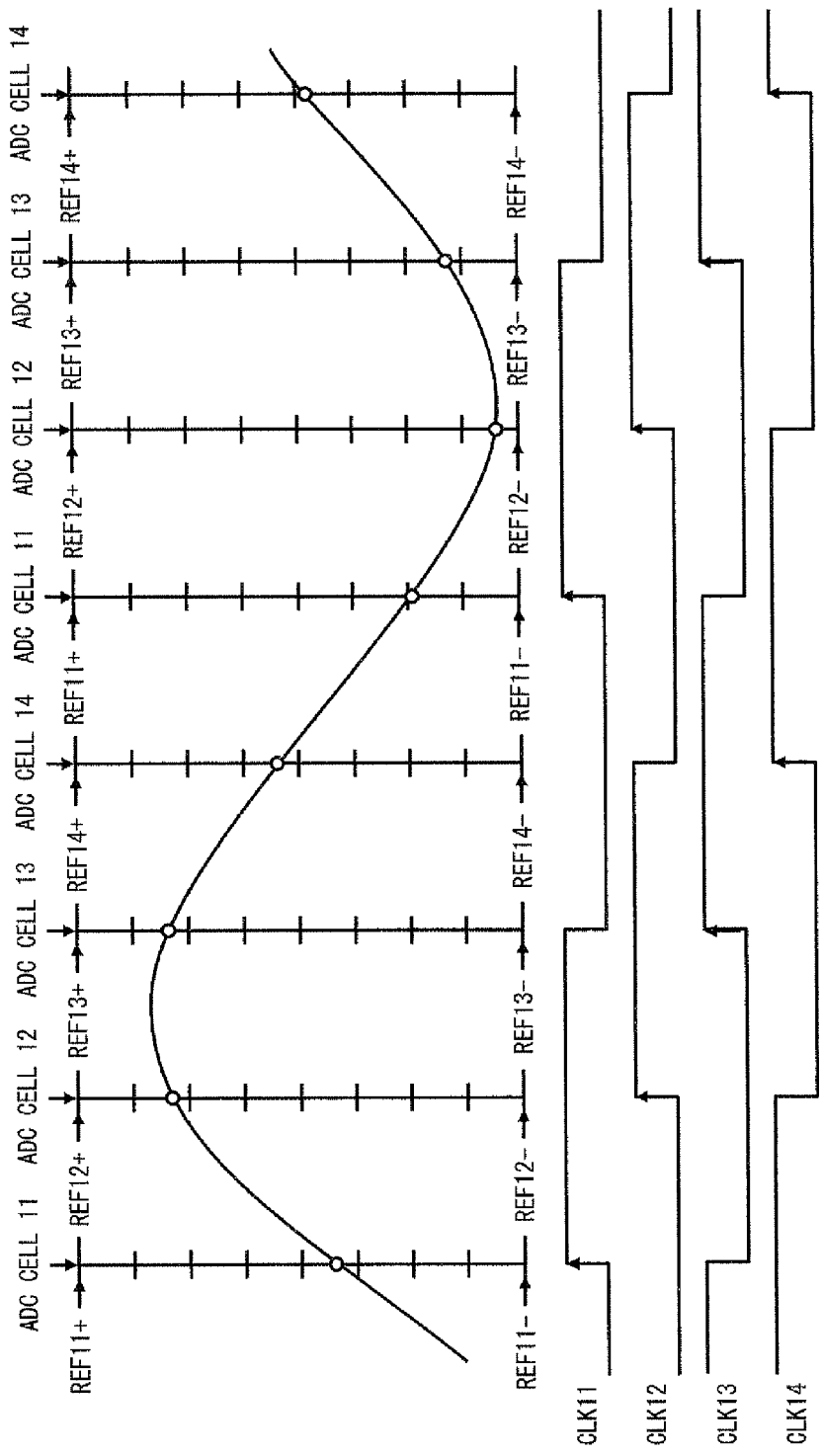
FIG. 8 is a timing chart showing an operation in a first mode of the analog-to-digital converter according to the second exemplary embodiment.

Now operations in the first to fifth modes of the analog-to-digital converter 2 according to the second exemplary embodiment shall be explained in more detail. FIG. 8 is a timing chart showing an operation in the first mode of the analog-to-digital converter 2 according to the second exemplary embodiment. As shown in FIG. 8, in the analog-to-digital converter 2 operating in the first mode, the ADC cells 11 to 14 sequentially perform a sampling operation. Moreover, the input ranges of the ADC cells 11 to 14 have the same voltage range. Accordingly, the analog-to-digital converter 2 according to the second exemplary embodiment can perform the conversion processing at a conversion speed four times higher than that which can be achieved by one ADC cell. That is, in the first mode, the analog-to-digital converter 1 realizes an improvement in the conversion speed by the time-interleaved configuration composed of the ADC cells 11 to 14.

Figure 9:
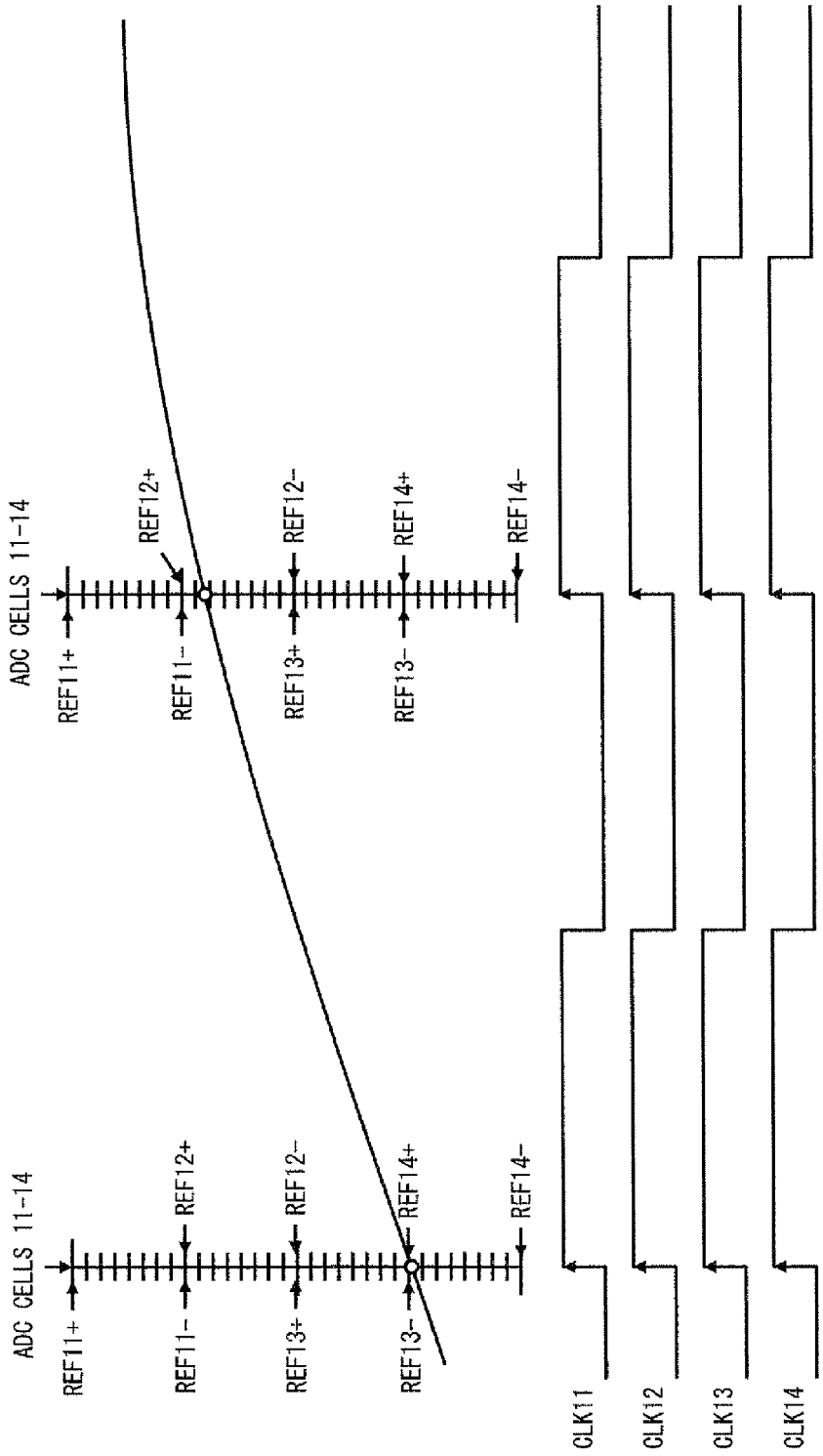
FIG. 9 is a timing chart showing an operation in a second mode of the analog-to-digital converter according to the second exemplary embodiment.

FIG. 9 is a timing chart showing an operation in the second mode of the analog-to-digital converter 2 according to the second exemplary embodiment. As shown in FIG. 9, in the second mode, in the analog-to-digital converter 2, the ADC cells 11 to 14 perform the conversion processing at the same sampling timings. Then, the input ranges of the ADC cells 11 to 14 are joined to achieve one input range. Hence, the analog-to-digital converter 2 can realize four times the conversion accuracy of one ADC cell. That is, in the analog-to-digital converter 2 realizes improvement in the conversion accuracy by the amplitude-interleaved configuration composed of the ADC cells 11 to 14 in the second mode.

Figure 10:
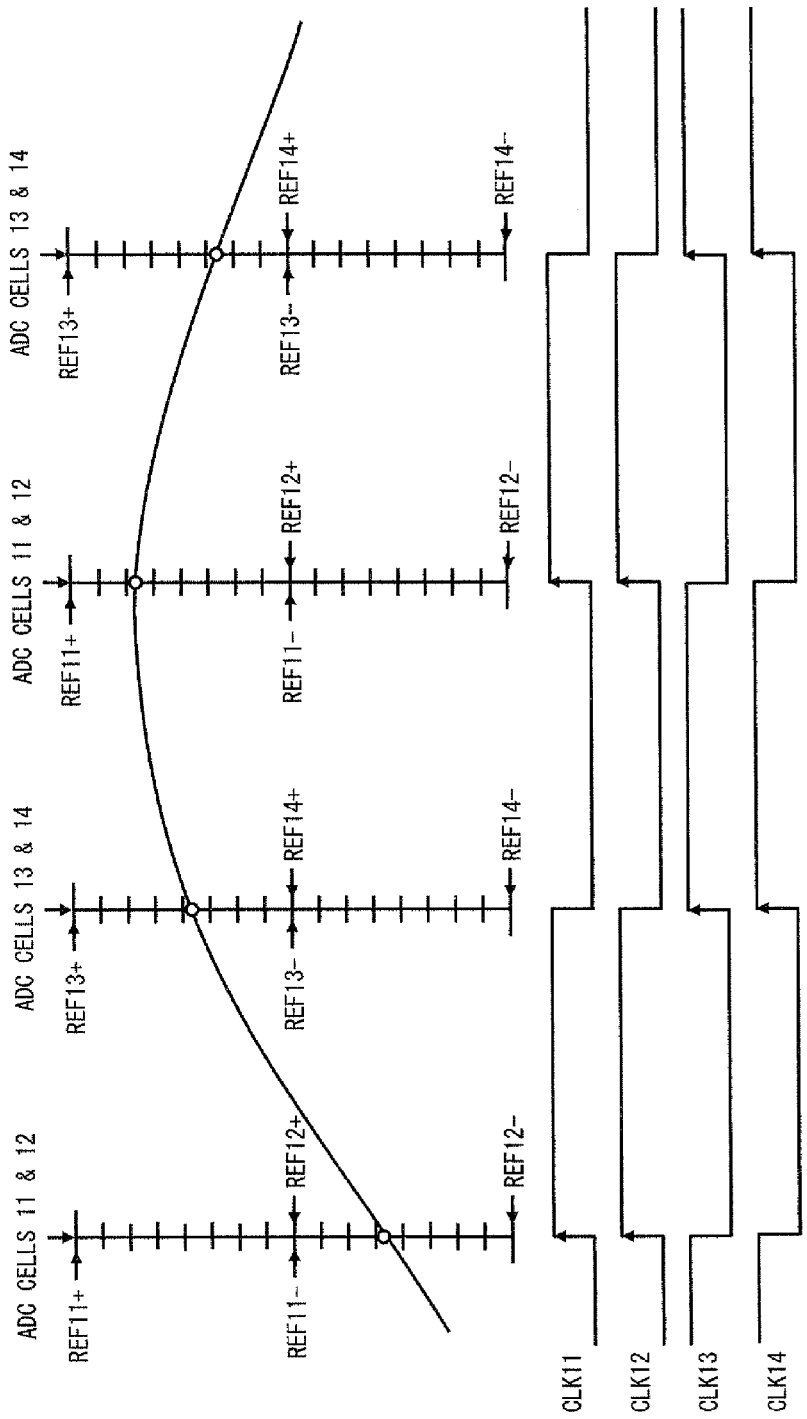
FIG. 10 is a timing chart showing an operation in a fifth mode of the analog-to-digital converter according to the second exemplary embodiment.

FIG. 10 is a timing chart showing an operation in the fifth mode of the analog-to-digital converter 2 according to the second exemplary embodiment. As shown in FIG. 10, in the fifth mode of the analog-to-digital converter 2, a first ADC cell group composed of the ADC cell 11 and the ADC cell 12 and a second ADC cell group composed of the ADC cell 13 and the ADC cell 14 perform a sampling operation alternately. Then, the input ranges of the first ADC cell group are set to one continuous input range, and the input ranges of the second ADC cell group are set to one continuous input range. Accordingly, the analog-to-digital converter 2 realizes conversion accuracy that is twice that of one ADC cell (an intermediate conversion accuracy that is higher than that in the first mode and lower than that in the second mode) and realizes an intermediate conversion speed that is lower than that in the first mode and higher than that in the second mode. That is, in the fifth mode, the analog-to-digital converter 2 realizes an improvement in the conversion speed and the conversion accuracy by a combination of the time-interleaved configuration and the amplitude-interleaved configuration composed of the ADC cells 11 to 14.

Figure 11:
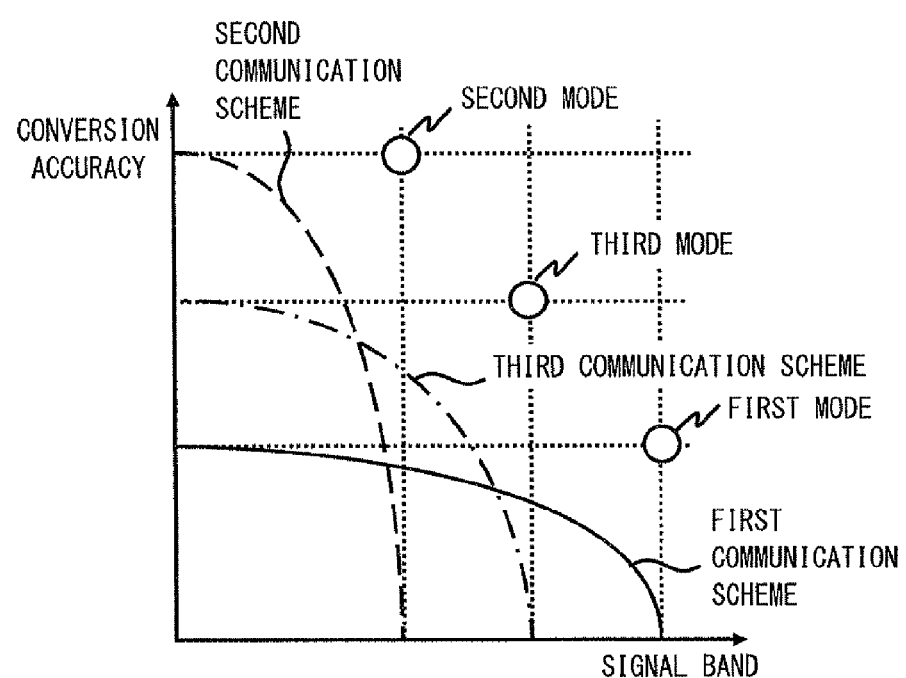
FIG. 11 is a graph showing a relationship between a signal band and conversion accuracy handled by the analog-to-digital converter according to the second exemplary embodiment.

FIG. 11 is a graph showing a relationship between a communication scheme that can be supported by the first mode shown in FIG. 8, a communication scheme that can be supported by the second mode shown in FIG. 9, and a communication scheme that can be supported by the fifth mode shown in FIG. 10. The analog-to-digital converter 2 according to the second exemplary embodiment supports a high conversion speed by the sequential sampling operations using the ADC cells 11 to 14 in the first mode. However, in the first mode, only one ADC cell operates in one sampling operation, thus the conversion accuracy of the first mode is the lowest among the three modes. By such an operation, the analog-to-digital converter 2 operating in the first mode can support the first communication scheme that requires a wide signal band and low conversion accuracy shown in FIG. 11.

Moreover, in the second mode of the analog-to-digital converter 2 according to the second exemplary embodiment, one continuous input range is formed by the input ranges of the ADC cells 11 to 14, and further, the ADC cells 11 to 14 perform the sampling operation at the same time, thereby supporting high conversion accuracy. However, in the second mode, the sampling speed is limited to the conversion speed of one ADC cell, and thus the conversion speed of the second mode is the lowest among the three modes. By such an operation, the analog-to-digital converter 2 operating in the second mode can support the second communication scheme that requires a narrow signal band and high conversion accuracy shown in FIG. 11.

Moreover, in the fifth mode of the analog-to-digital converter 2 according to the second exemplary embodiment, the input ranges of the first ADC cell group and the second ADC cell group are respectively formed as one continuous input ranges, and further, the first ADC cell group and the second ADC cell group perform the sampling operation alternately, thereby supporting the intermediate conversion accuracy and the intermediate conversion speed. By such an operation, the analog-to-digital converter 2 operating in the fifth mode can support the third communication scheme that requires an intermediate signal band and intermediate conversion accuracy shown in FIG. 11.

As explained above, in the analog-to-digital converter 2 according to the second exemplary embodiment, the ADC cell control unit 11 switches the input ranges of the ADC cells 11 to 1n based on the circuit configuration values selected by the circuit configuration control unit 110 according to the mode specifying signal MD, and the sampling clock generation unit 112 switches the sampling timings of the ADC cells 11 to 1n. At this time, as the analog-to-digital converter 2 according to the second exemplary embodiment includes more ADC cells than are in the analog-to-digital converter 1 according to the first exemplary embodiment, the analog-to-digital converter 2 can realize more combinations of the ADC cells than are realized by the analog-to-digital converter 1. With more combinations of the ADC cells, the analog-to-digital converter 2 can support more communication schemes than are supported by the analog-to-digital converter 1.

Here, the analog-to-digital converter 2 according to the second exemplary embodiment realizes a performance conforming to characteristics of signals used in the respective communication schemes by rearranging the input ranges and sampling timings of the ADC cells 11 to 1n. In other words, in the analog-to-digital converter 2 according to the second exemplary embodiment, there is no ADC cell that is not used for the conversion processing while any of the plurality of communication schemes that require different performances is being processed. Thus, the analog-to-digital converter 2 according to the second exemplary embodiment will not supply power to a circuit that does not operate in the conversion processing of any of the communication schemes. That is, by using the analog-to-digital converter 2 according to the second exemplary embodiment, it is possible to reduce the power consumption while supporting a plurality of communication schemes that require different performances.

Furthermore, in the analog-to-digital converter 2 according to the second exemplary embodiment, there is no circuit that does not operate while signals in any of the communication schemes are being input. The usage efficiency of the circuits is thus high, and the size of the circuit can be reduced more than the size of the analog-to-digital converter that is configured using a related technique and supports a plurality of communication schemes can be reduced.

Third Exemplary Embodiment

Figure 12:
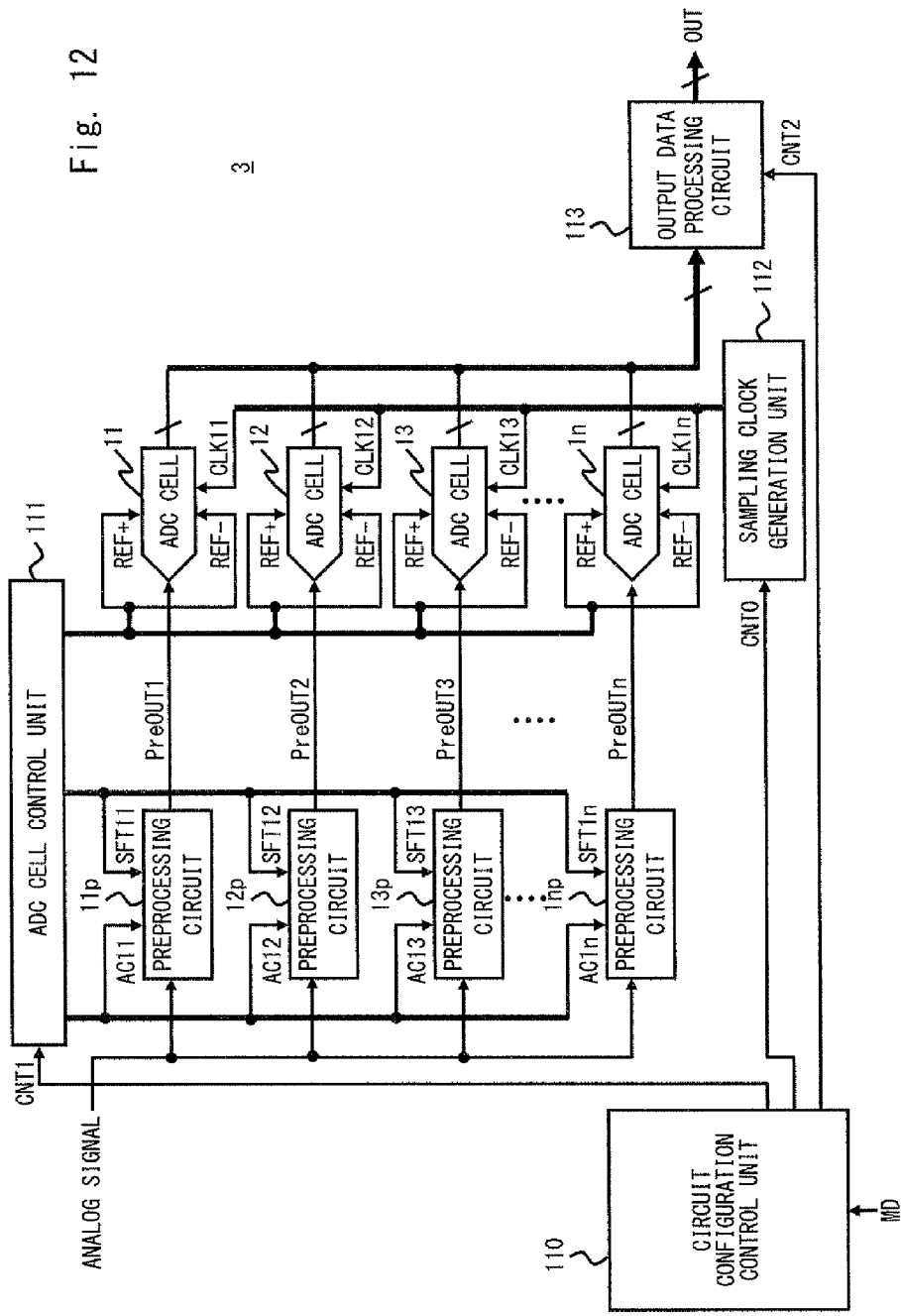
FIG. 12 is a block diagram of an analog-to-digital converter according to a third exemplary embodiment.

FIG. 12 is a block diagram of an analog-to-digital converter 3 according to a third exemplary embodiment. As shown in FIG. 12, the analog-to-digital converter 3 further includes, in addition to the circuits in the analog-to-digital converter 2 according to the second exemplary embodiment, preprocessing circuits 11p to 1np. Moreover, the analog-to-digital converter 3 supplies maximum reference voltages and minimum reference voltages, which are the same voltages respectively, to the ADC cells 11 to 1n. Therefore, in FIG. 12, a maximum reference voltage REF+ and a minimum reference voltage REF− are supplied to all of the ADC cells 11 to 1n. Thus, as a variation range of an analog signal which will be input to the analog-to-digital converter 3, a range larger than the input voltage ranges of the respective ADC cells 11 to 1n, that is, a range larger than a range between the maximum reference voltage REF+ and the minimum reference voltage REF− can be supported. The method shall be explained below.

The preprocessing circuits 11p to 1np convert amplitudes of analog signals to be in the voltage range convertable by first to nth analog-to-digital conversion cells and output the analog signals as intermediate analog signals. For example, when the number of the ADC cells is two, the preprocessing circuit 11p generates a first signal for conversion PreOUT1 that is obtained by level-shifting a signal level of the intermediate analog signal by a first shift amount corresponding to the voltage range of the first input range, and the preprocessing circuit 12p generates a second signal for conversion PreOUT2 that is obtained by level-shifting a signal level of the intermediate analog signal by a second shift amount corresponding to the voltage range of the second input range. Then, the preprocessing circuit 11p outputs the first signal for conversion to the ADC cell 11, and the preprocessing circuit 12p outputs the second signal for conversion to the ADC cell 12. In this case, as the signals for conversion PreOUT1 to n which will be input to the first to nth analog-to-digital conversion cells are obtained by level-shifting the original analog voltages, there is no change in the amplitude. Accordingly, it might be possible to input a voltage outside the convertable range t to the respective analog-to-digital conversion cells. Processing in the case when a voltage outside the convertable range is input to the analog-to-digital conversion cell shall be explained later.

Note that, in the analog-to-digital converter 3 shown in FIG. 12, n preprocessing circuits are shown corresponding to the number of ADC cells for ease of explanation. However, the preprocessing circuit may be provided as one circuit block. In this case, the preprocessing circuit amplifies or attenuates the amplitudes of the analog signals to be in the voltage range convertable by the first to nth analog-to-digital conversion cells, to thereby generate the intermediate analog signals and level-shift the signal levels of the intermediate analog signals to generate the signals for conversion PreOUT1 to PreOUTn. Then, the preprocessing circuit supplies the plurality of the signals for conversion PreOUT1 to PreOUTn to the ADC cells, respectively.

Figure 13:
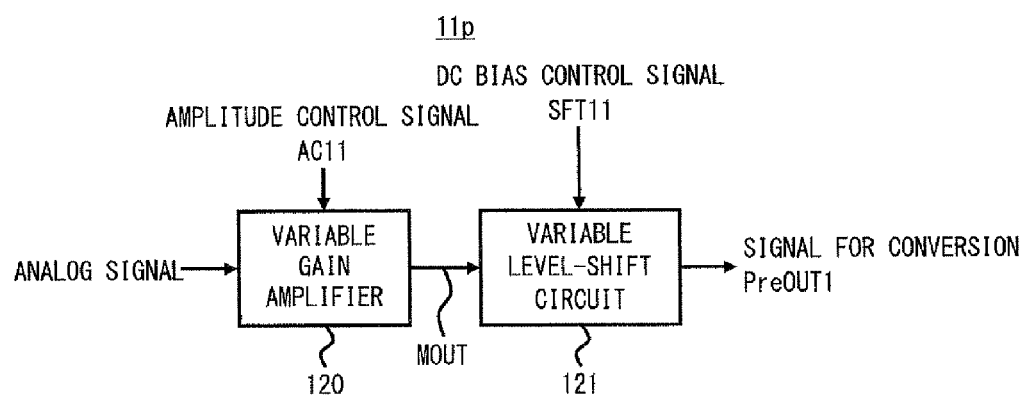
FIG. 13 is a block diagram of a preprocessing circuit of the analog-to-digital converter according to the third exemplary embodiment.

As the preprocessing circuits 11p to 1np have the same circuit configuration, a detailed explanation of only the preprocessing circuit 11p is given as an example. FIG. 13 is a block diagram of the preprocessing circuit 11p. As shown in FIG. 13, the preprocessing circuit 11p includes a variable gain amplifier 120 and a variable level-shift circuit 121. Note that if only the level-shifting will be performed without amplitude adjustment, the variable gain amplifier 120 may be removed.

The variable gain amplifier 120 determines the size of an amplification factor according to a value of an amplitude control signal AC11. Then, the variable gain amplifier 120 amplifies an analog signal according to the determined the amplification and generates an intermediate analog signal MOUT. Note that the amplification factor of the variable gain amplifier 120 is set so that a maximum amplitude of the intermediate analog signal MOUT will be in a voltage range convertable by a plurality of ADC cells at one sampling timing.

The variable level-shift circuit 121 level-shifts a signal level of the intermediate analog signal MOUT according to a value of a DC bias control signal SFT11 and generates the first signal for conversion PreOUT1.

Moreover, in the analog-to-digital converter 3 according to the third exemplary embodiment, the circuit configuration values of the configuration table of the circuit configuration control unit 110 include a value specifying the value of the amplitude control signal AC11 and a value specifying the value of the DC bias control signal SFT11. FIG. 14 shows an example of the configuration table used by the analog-to-digital converter 3 according to the third exemplary embodiment.

In the example shown in FIG. 14, the number of ADC cells is four. Moreover, the example shown in FIG. 14 is the case in which the analog-to-digital converter 3 has the first mode and the second mode. The first mode shown in FIG. 14 (when the value of the mode specifying signal MD is 0) is for performing an operation the same as that performed by the first mode of the analog-to-digital converter 2 according to the second exemplary embodiment. In the example shown in FIG. 14, 0 dB is defined as a circuit configuration value corresponding to the amplitude control signals AC11 to AC14 in the first mode, and 0V is defined as a circuit configuration value corresponding to the DC bias control signals SFT11 to SFT14.

The second mode shown in FIG. 14 (when the value of the mode specifying signal MD is 1) is for performing an operation the same as that performed by the second mode of the analog-to-digital converter 2 according to the second exemplary embodiment. In the example shown in FIG. 14, in the second mode, 0 dB is defined as a circuit configuration value corresponding to the amplitude control signals AC11 to AC14, −3VDD/4 is defined as a circuit configuration value corresponding to the DC bias control signal SFT11, −VDD/2 is defined as a circuit configuration value corresponding to the DC bias control signal SFT12, −VDD/4 is defined as a circuit configuration value corresponding to the DC bias control signal SFT13, and 0V is defined as a circuit configuration value corresponding to the DC bias control signal SFT14. Moreover, in the analog-to-digital converter 3 according to the third exemplary embodiment, VDD/4 is defined as a circuit configuration value that specifies the maximum reference voltage REF+, and GND is defined as a circuit configuration value that specifies the minimum reference voltage REF−. That is, in the second mode according to the third exemplary embodiment, the input range of the analog-to-digital converter 3 from the ground voltage GND to the power supply voltage VDD is realized using the ADC cells 11 to 14.

The ADC cell control unit 111 varies the amplification factor of the variable gain amplifier 120 according to the above-mentioned circuit configuration values and also varies the shift amount of the variable level-shift circuit.

Figure 15:
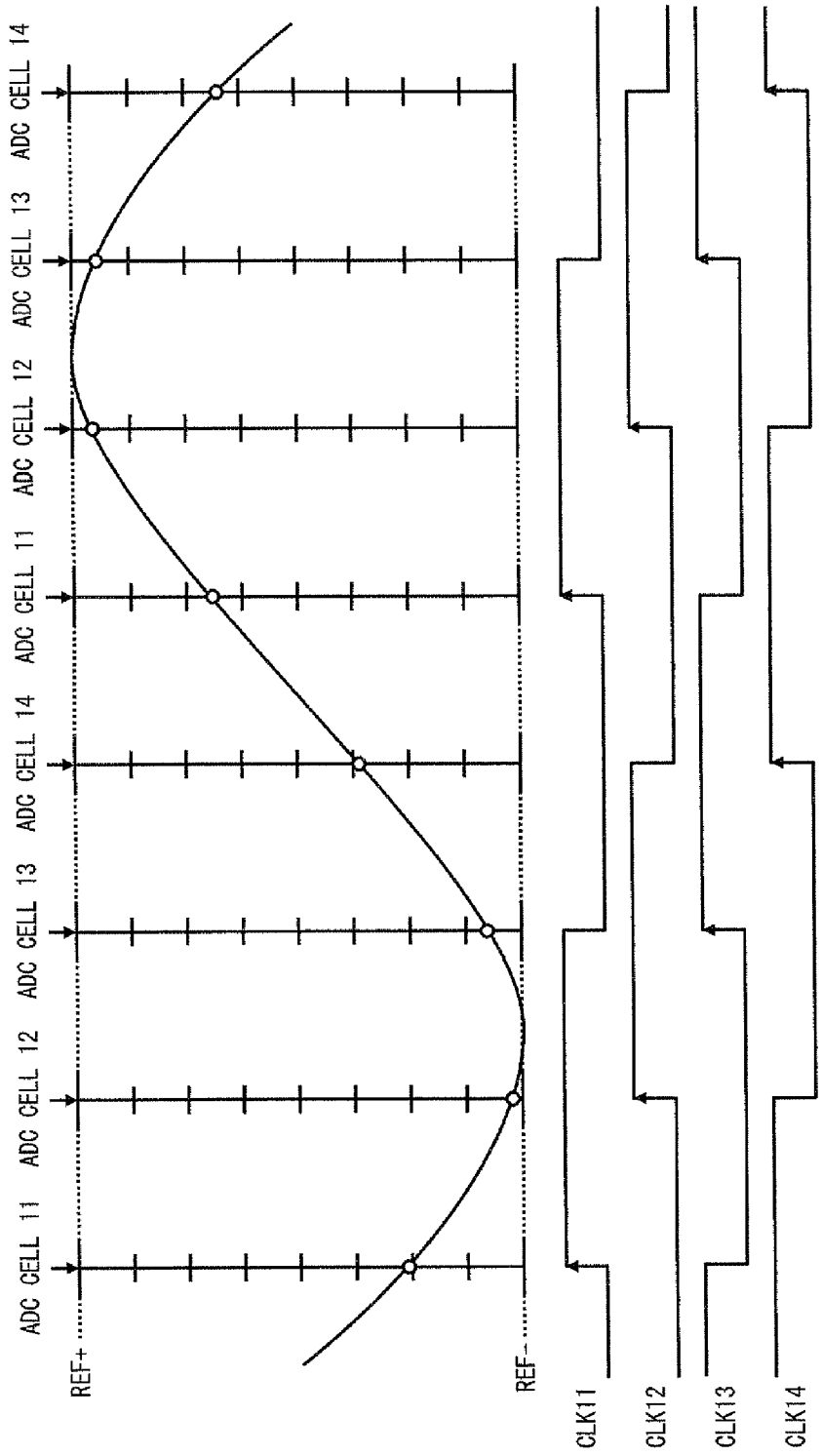
FIG. 15 is a timing chart showing an operation in a first mode of the analog-to-digital converter according to the third exemplary embodiment.

Next, operations in the first and second modes of the analog-to-digital converter 3 according to the third exemplary embodiment, respectively, shall be explained in more detail. FIG. 15 is a timing chart showing an operation in the first mode of the analog-to-digital converter 3 according to the third exemplary embodiment. As shown in FIG. 15, in the analog-to-digital converter 3 operating in the first mode, the ADC cells 11 to 14 sequentially perform a sampling operation. Moreover, the input ranges of the ADC cells 11 to 14 have the same voltage range. Accordingly, the analog-to-digital converter 3 according to the third exemplary embodiment can perform the conversion processing at a conversion speed that is four times the conversion speed that can be achieved by one ADC cell. That is, in the first mode, the analog-to-digital converter 3 realizes an improvement in the conversion speed by the time-interleaved configuration composed of the ADC cells 11 to 14.

Figure 16:
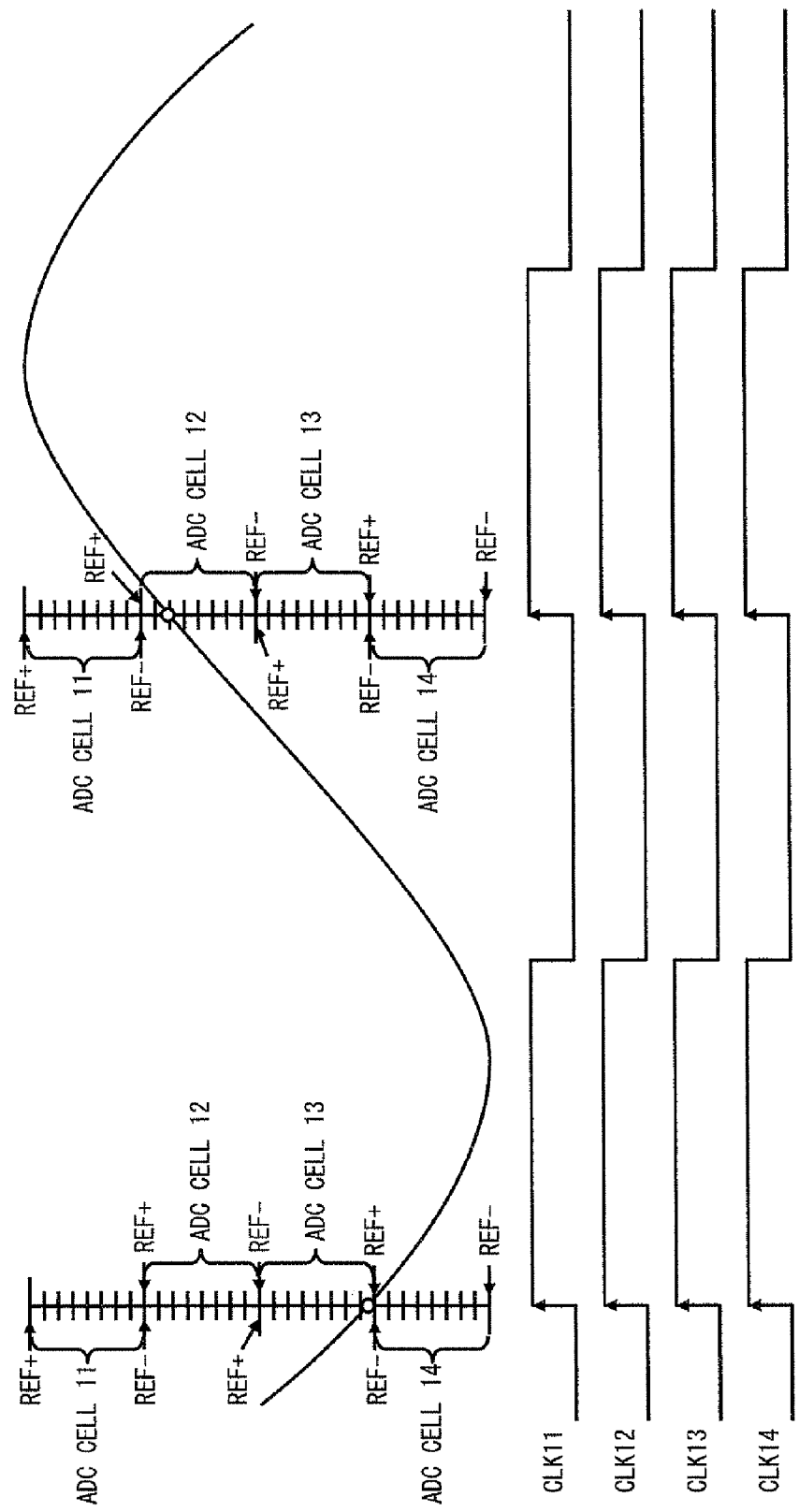
FIG. 16 is a timing chart showing an operation in a second mode of the analog-to-digital converter according to the third exemplary embodiment.

FIG. 16 is a timing chart showing an operation in the second mode of the analog-to-digital converter 3 according to the third exemplary embodiment. As shown in FIG. 16, in the second mode of the analog-to-digital converter 3, the ADC cells 11 to 14 perform the conversion processing at the same sampling timings. Further, in the analog-to-digital converter 3, the input ranges of the ADC cells 11 to 14 are the same voltage range, but by level-shifting the signal levels of the signals for conversion according to the respective ADC cells, the conversion processing is performed on all ranges of the signals for conversion. Hence, the analog-to-digital converter 3 can realize conversion accuracy that is four times the conversion accuracy of one ADC cell. That is, the analog-to-digital converter 3 realizes an improvement in the conversion accuracy by the amplitude-interleaved configuration composed of the ADC cells 11 to 14 in the second mode.

Figure 17:
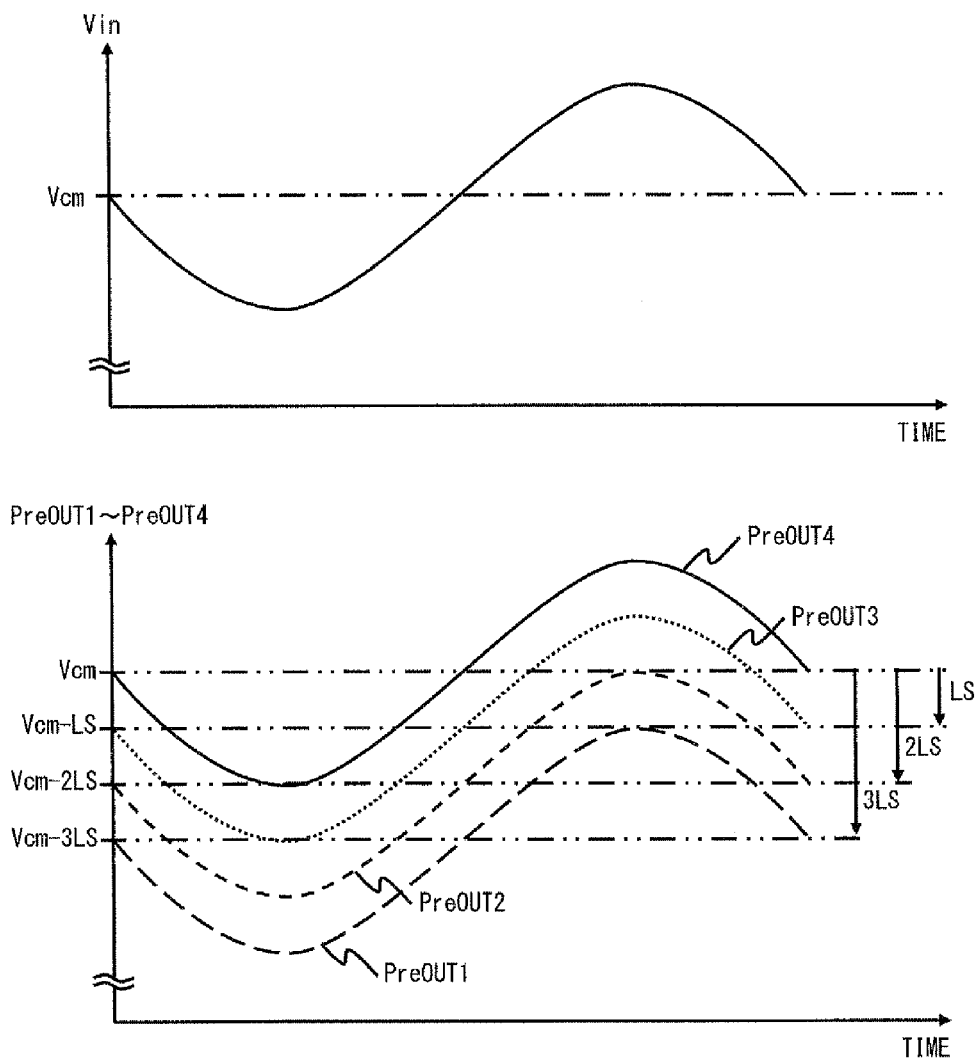
FIG. 17 is a timing chart showing an operation of the preprocessing circuit in the second mode of the analog-to-digital converter according to the third exemplary embodiment.

An operation of the preprocessing circuits 11p to 1np shall now be explained in more detail. An example in which the number of ADC cells is four is explained here. FIG. 17 is a timing chart showing an operation of the preprocessing circuit in the second mode of the analog-to-digital converter.

Note that in the first mode, as the shift amount is 0V in all the preprocessing circuits, an explanation of the operation in the first mode shall be omitted.

As shown in FIG. 17, in the second mode, an analog signal Vin is input. Moreover, this analog signal Vin has an amplitude center voltage Vcm. As the amplitude control signals AC11 to AC14 are 0 dB, the preprocessing circuits 11p to 1np use this analog signal as the intermediate analog signal MOUT. Next, the preprocessing circuits 11p to 1np level-shift the intermediate analog signal MOUT according to the DC bias control signals SFT11 to SFT14 and generate the signals for conversion PreOUT1 to PreOUT4.

At this time, as −3VDD/4 is specified as the value of the DC bias control signal SFT11, a DC bias level of the signal for conversion PreOUT1 is lower than that of the intermediate analog signal by −3VDD/4. As −VDD/2 is specified as the value of the DC bias control signal SFT12, a DC bias level of the signal for conversion PreOUT2 is lower than that of the intermediate analog signal by −VDD/2. As −VDD/4 is specified as the value of the DC bias control signal SFT13, a DC bias level of the signal for conversion PreOUT3 is lower than that of the intermediate analog signal by −VDD/4. As 0V is specified as the value of the DC bias control signal SFT14, the signal level of the signal for conversion PreOUT1 is the same as that of the intermediate analog signal.

Figure 18:
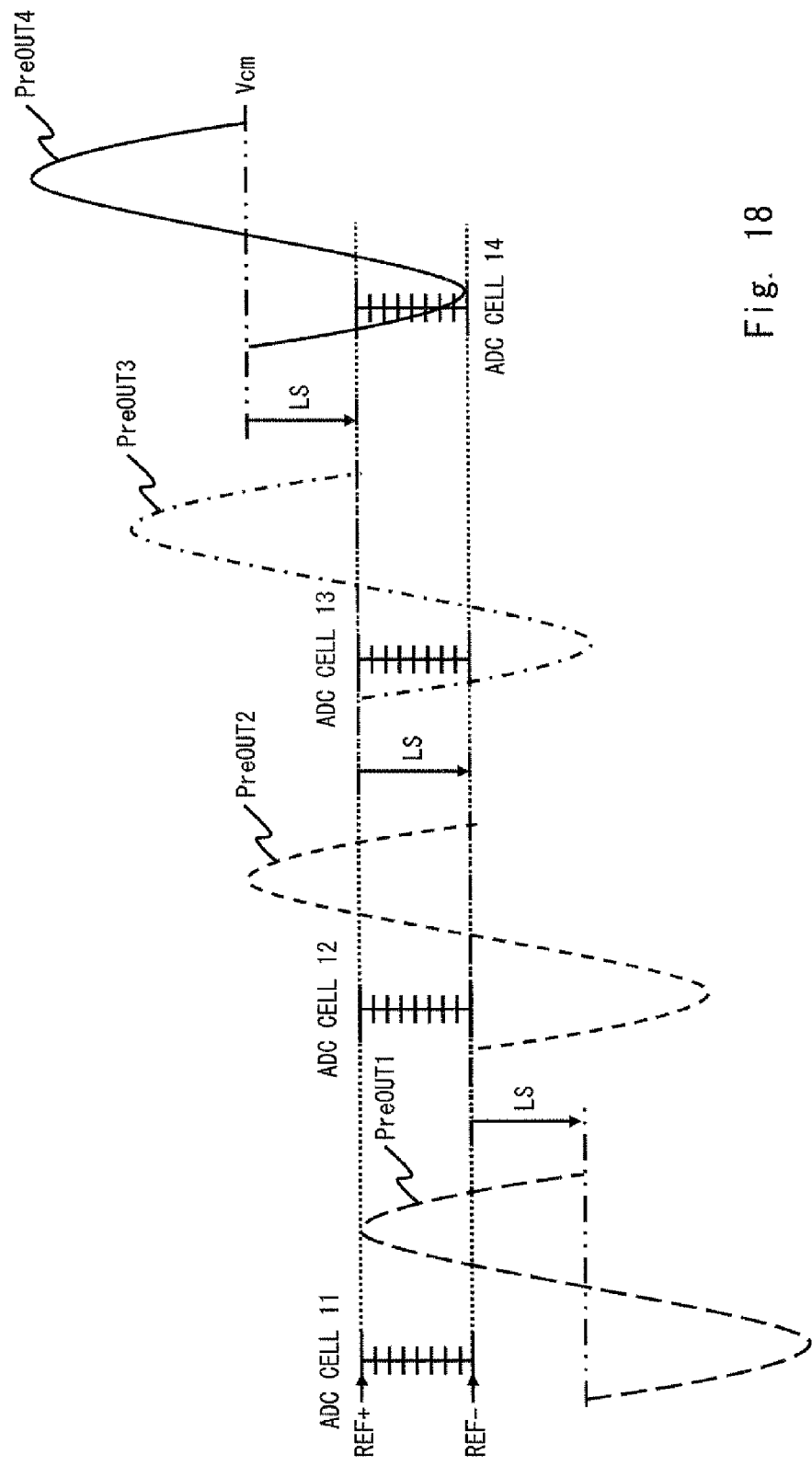
FIG. 18 is a diagram showing an example of assigning input ranges in the second mode of the analog-to-digital converter according to the third exemplary embodiment.

Next, a relationship between the signals for conversion PreOUT1 to PreOUT4 and the input ranges of the ADC cells 11 to 14 shall be explained. FIG. 18 shows an example of assigning the input ranges of the analog-to-digital converter according to the third exemplary embodiment in the second mode. As shown in FIG. 18, in the third exemplary embodiment, the signals for conversions obtained by level-shifting the intermediate analog signal MOUT are supplied to the ADC cells 11 to 14. Then, an upper quarter of the intermediate analog signal is assigned to the input range of the ADC cell 11, a portion of the intermediate analog signal from an upper quarter to an upper half thereof is assigned to the input range of the ADC cell 12, a portion of the intermediate analog signal from a lower half to a lower quarter thereof is assigned to the input range of the ADC cell 13, and a lower quarter of the intermediate analog signal is assigned to the input range of the ADC cell 14.

Note that as mentioned above, it may be possible to input a voltage outside the convertable range to the respective ADC cells. For example, in FIG. 18, there is a period for the ADCs 11 to 14 in which analog signals outside the ranges convertable by the respective ADC 11 to 14 are input. In such a period, digital values output by the ADCs 11 to 14 are invalid. In general, the ADC cell has a function that outputs an over-range signal if a signal exceeds an upper limit of the convertable range and outputs an under-range signal if a signal falls below a lower limit of the convertable range. It is thus easily realizable to adopt only effective digital values using these signals. Alternatively, the ADC cells 11 to 14 may output a signal indicating the effectiveness of the digital value together with the digital value. In a further alternative, when an analog signal outside the convertable range is input, the ADC cells 11 to 14 may clip the analog signal to predetermined digital values such as a minimum value and a maximum value, output a clipping monitor signal indicating the clipped state thereof, and when a different ADC is outputting an effective digital value, may adopt the effective digital value.

According to the above explanation, in the analog-to-digital converter 3 according to the third exemplary embodiment, the preprocessing circuit level-shifts the analog signal, to thereby control assignment of the ranges of the signal levels in which the plurality of ADC cells perform the conversion processing. That is, the analog-to-digital converter 3 according to the third exemplary embodiment is a form of controlling assignment of the input ranges in which the ADC cells perform the conversion processing, which is different from that of the second mode in the first and second exemplary embodiments.

Note that, although in the above-mentioned explanation, the input range of the analog-to-digital converter 3 in the first mode is set to be the same as the input range of the analog-to-digital converter 3 in the second mode, the input range of the analog-to-digital converter 3 in the second mode may be greater than that in the first mode. For example, the input range of the analog-to-digital converter 3 in the second mode can be four times greater than that of the analog-to-digital converter 3 in the first mode. In this case, the circuit configuration values corresponding to the second mode are: AC11 to AC14=12dB; SFT11=−3VDD; SFT12=−2VDD; SFT13=−VDD; SFT14=0V; VREF+=VDD; VREF−=GND; and CLK11 to CLK14=0deg.

Fourth Exemplary Embodiment

Figure 19:
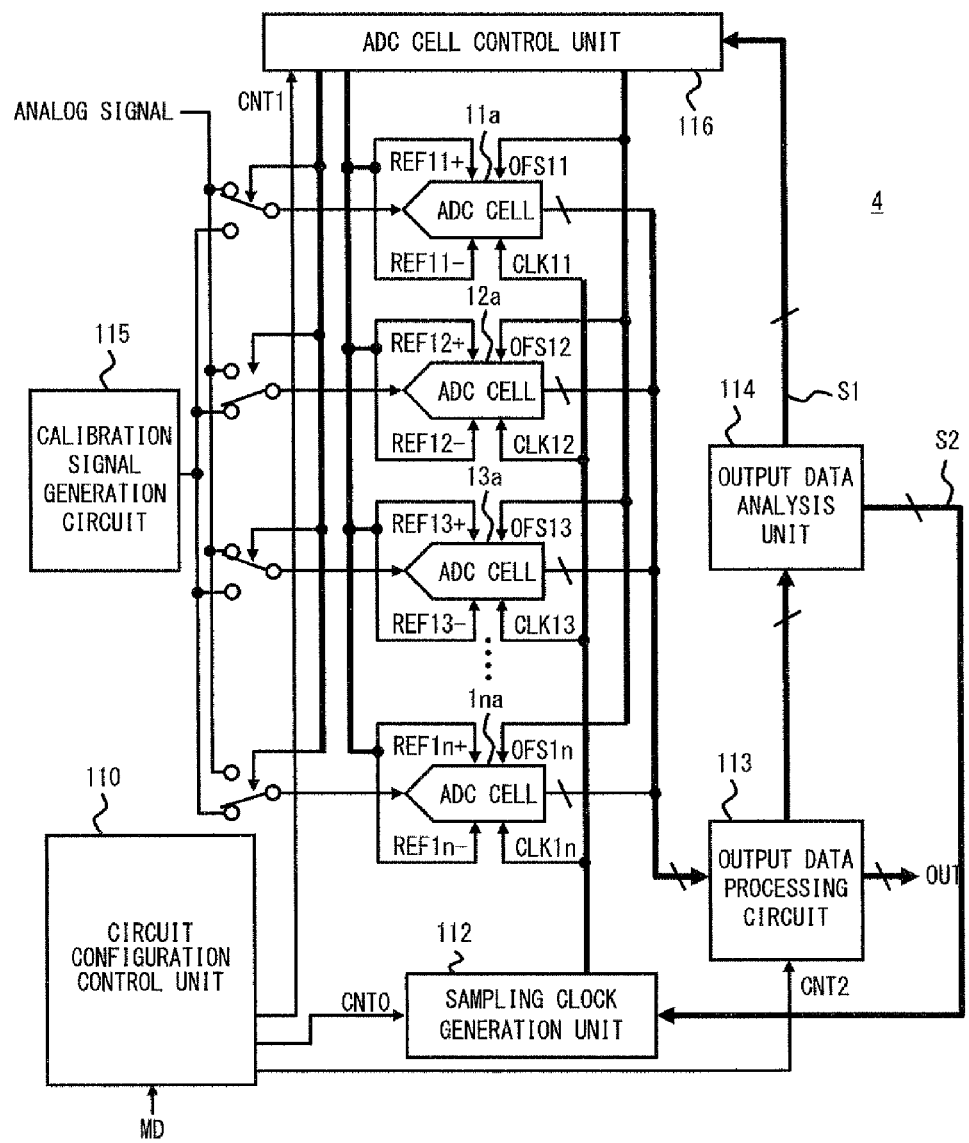
FIG. 19 is a block diagram of a preprocessing circuit of an analog-to-digital converter according to a fourth exemplary embodiment.

FIG. 19 is a block diagram of an analog-to-digital converter 4 according to a fourth exemplary embodiment. As shown in FIG. 19, the analog-to-digital converter 4 according to the fourth exemplary embodiment further includes, in addition to the circuits in the analog-to digital converter 2 according to the second exemplary embodiment, an output data analysis unit 114 and a calibration signal generation circuit 115. Moreover, in the analog-to-digital converter 4 according to the fourth exemplary embodiment, in order to support a calibration operation, an ADC cell control unit 116 is provided in place of the ADC cell control unit 111, and ADC cells 11a to 1na are provided in place of the ADC cells 11 to 1n. The case in which the number of ADC cells n is two shall be explained below.

The output data analysis unit 114 analyzes the size of an error between digital values output by the ADC cells 11a and 12a and an ideal value. When the mode specifying signal MD indicates the fourth mode, the circuit configuration control unit 110 according to the fourth exemplary embodiment outputs the circuit configuration values instructing one of the ADC cells 11a and 12a to perform the conversion processing on the analog signal, and the other one of the ADC cells 11a and 12a to perform the conversion processing on a calibration signal. Then, the output data analysis unit 114 generates a correction value that corrects a deviation between the digital value, which is a digital value obtained by converting the calibration signal from the output data processing unit 113 based on the circuit configuration values that are output corresponding to the fourth mode, and the ideal value of the said digital value, and supplies the correction value to the ADC cell control unit 115.

The calibration signal generation circuit 115 generates the calibration signal. Note that the analog-to-digital converter 4 includes a switch circuit that selects whether to supply the analog signal supplied from outside or the calibration signal to the ADC cells.

The ADC cell control unit 116 switches a signal which will be selected by the switch circuit based on the circuit configuration values output by the circuit configuration control unit 110. Moreover, the ADC cell control unit 116 corrects at least one of the voltage ranges of the first and second input ranges and input offset voltages of the ADC cells 11a and 12a based on the correction value.

The ADC cells 11a and 12a include a function to vary the input offset voltages based on values of offset adjustment signals OFS11 and 12 that are output from the ADC cell control unit 116.

In the analog-to-digital converter 4 according to the fourth exemplary embodiment, some of the plurality of ADC cells are used to perform the conversion processing on the analog signal. Meanwhile, in the analog-to-digital converter 4 according to the fourth exemplary embodiment, the calibration signal is supplied to the ADC cells different from the ones used for the conversion processing, to thereby perform calibration processing. Then, the ADC cell that has been performing the calibration processing and the ADC cell that has been performing the conversion processing are switched at regular intervals. Note that a detailed explanation of the calibration processing is provided in Japanese Unexamined Patent Application Publication No. 2011-49646 that has been filed by the present inventors.

Hence, the analog-to-digital converter 4 according to the fourth exemplary embodiment can continuously perform the conversion processing with few errors. The conversion error will become greater due to the influence of environmental changes, such as temperature and deterioration of the semiconductor elements, even when the conversion processing is continuously performed. Accordingly, correcting the conversion error by such calibration processing has a considerable significance.

Note that when there is a period in which the conversion processing is not performed on the input analog signal, such as at the time of startup of the analog-to-digital converter 4, calibration signals may be supplied to all the ADC cells and the calibration processing may be performed in such a period.

Fifth Exemplary Embodiment

Figure 20:
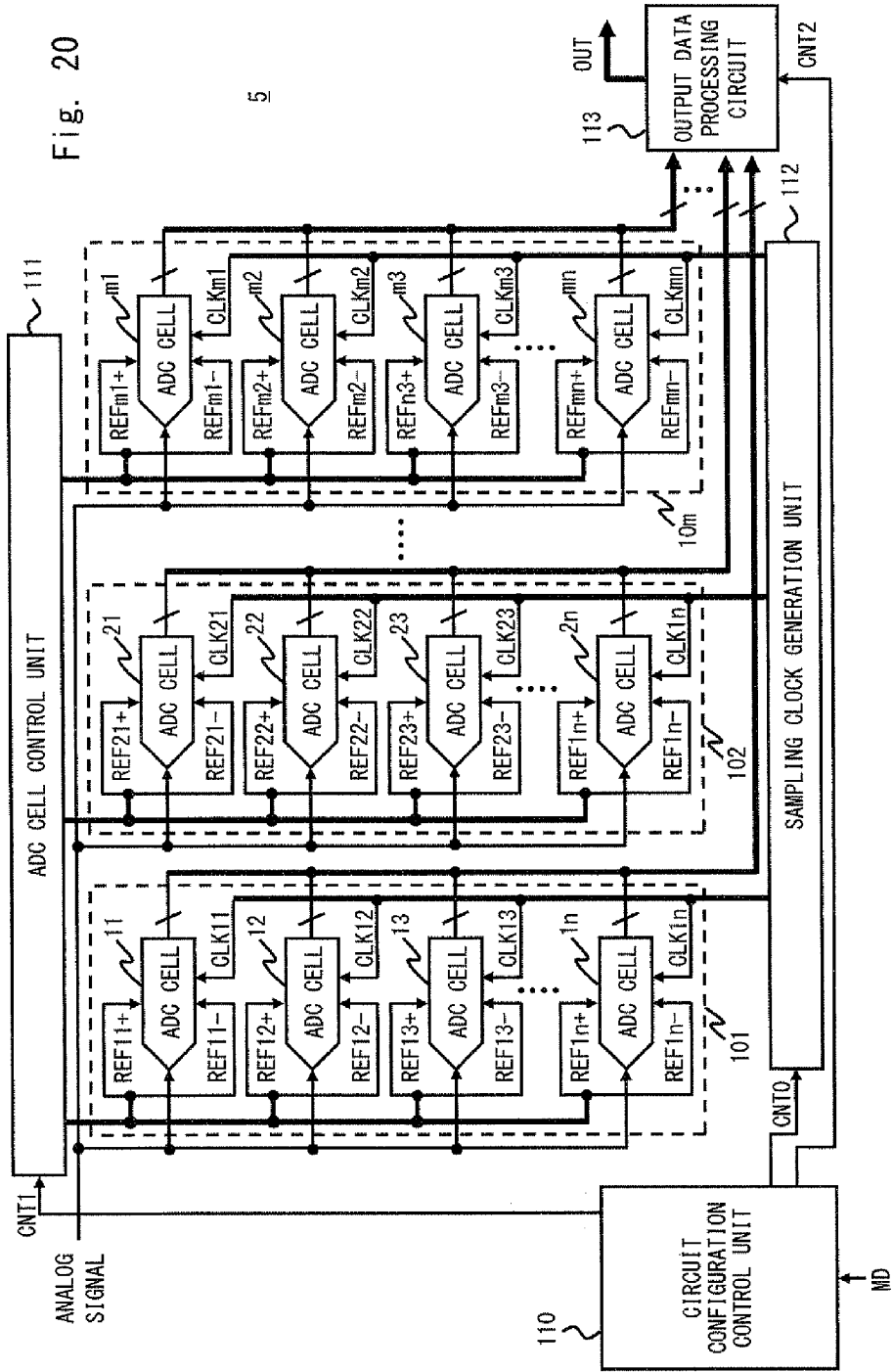
FIG. 20 is a block diagram of a preprocessing circuit of an analog-to-digital converter according to a fifth exemplary embodiment.

FIG. 20 is a block diagram of an analog-to-digital converter 5 according to a fifth exemplary embodiment. As shown in FIG. 20, the analog-to-digital converter 5 according to the fifth exemplary embodiment includes an ADC cell array in which a plurality of ADC cells having a function the same as that of the ADC cells 11 and 12 are arranged in an array. The example shown in FIG. 20 illustrates an ADC cell array of n rows and m columns (n is an integer indicating the number of rows of the cell array, and m is an integer indicating the number of columns of the cell array). Moreover, in the example shown in FIG. 20, ADC cells 11 to 1n are defined as a first sub-ADC cell array 101, ADC cells 21 to 2n are defined as a second sub-ADC cell array 102, and ADC cells m1 to mn are defined as an mth ADC cell array 10m.

The analog-to-digital converter 5 according to the fifth exemplary embodiment includes the circuit configuration control unit 110, the ADC cell control unit 111, the sampling clock generation unit 112, and the output data processing circuit 113. As the basic functions of these circuit blocks are the same as those of the blocks of the analog-to-digital converter 1 according to the first exemplary embodiment, an explanation thereof is omitted here.

A configuration table of the circuit configuration control unit 110 according to the fifth exemplary embodiment includes the circuit configuration values that specify one of the plurality of ADC cells used to perform the operation corresponding to the first and second modes (or other modes). FIG. 21 shows an example of the configuration definition table of the analog-to-digital converter 5 according to the fifth exemplary embodiment. The example of the configuration definition table shown in FIG. 21 assumes n=4 and m=4. The configuration definition table shown in FIG. 21 is for arranging the ADC cells in the amplitude-interleaved configuration by using the ADC cell array and arranging the plurality of sub-ADC arrays in the time-interleaved configuration.

Figure 22:
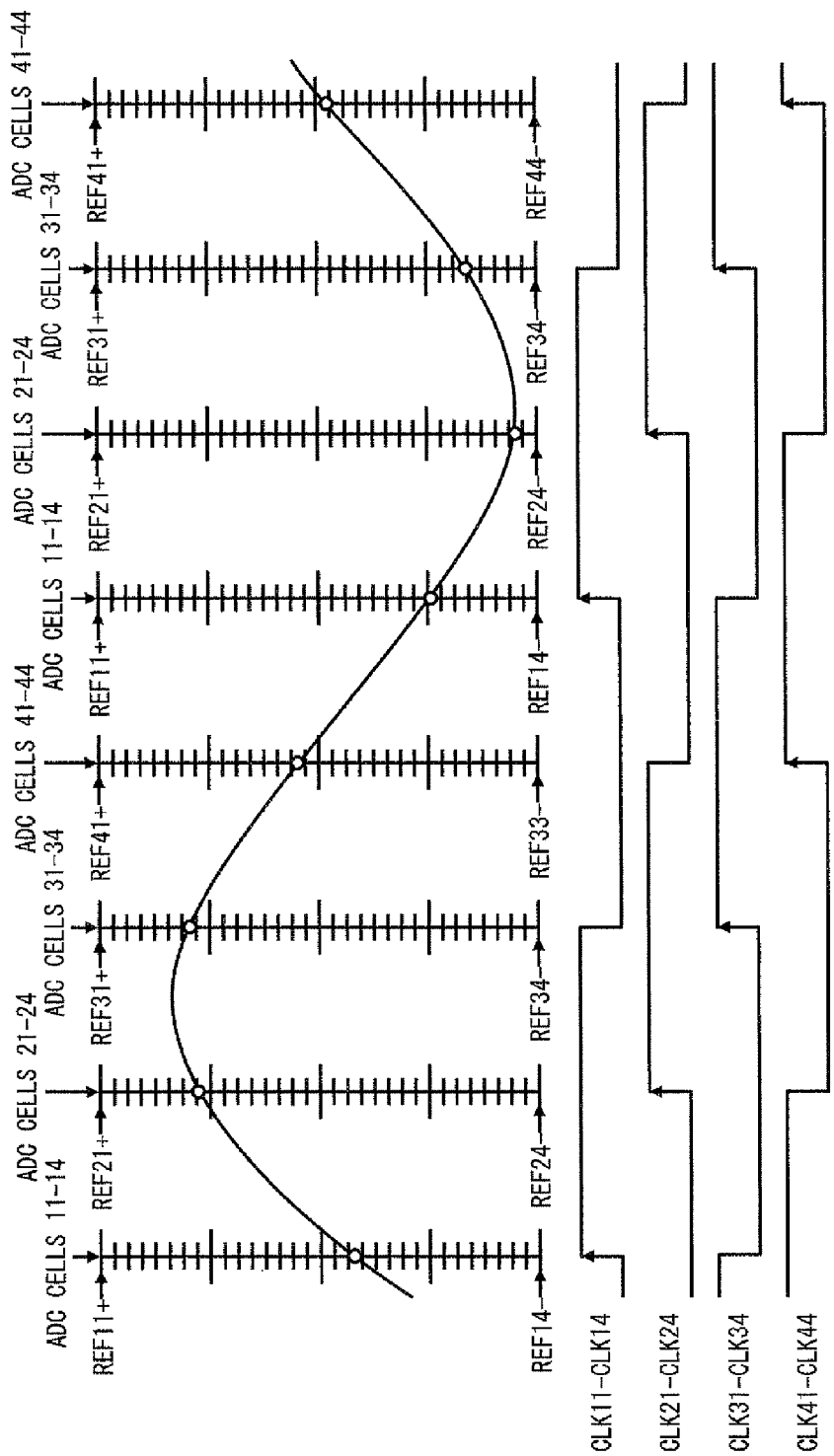
FIG. 22 is a timing chart showing an operation of the analog-to-digital converter according to the fifth exemplary embodiment corresponding to the configuration table shown in FIG. 21.

FIG. 22 is a timing chart showing an operation of the analog-to-digital converter 5 according to the fifth exemplary embodiment based on the configuration definition table shown in FIG. 21. As shown in FIG. 22, the analog-to-digital converter 5 that operates based on the configuration definition table shown in FIG. 21 operates the respective sub-ADC cell arrays in the amplitude-interleaved configurations, to thereby perform the conversion processing with higher accuracy than in the conversion processing by one ADC cell. Moreover, the analog-to-digital converter 5 that operates based on the configuration table shown in FIG. 21 operates the sub-ADC cell arrays in the time-interleaved configuration, to thereby perform the conversion processing at an operation speed that is higher than that at which the conversion processing by one ADC cell is performed. That is, the analog-to-digital converter 5 that operates based on the configuration definition table shown in FIG. 21 can achieve operation characteristics with the highest conversion accuracy and the highest conversion speed in the graph shown in FIG. 11.

FIG. 23 shows another example of the configuration definition table of the analog-to-digital converter 5 according to the fifth exemplary embodiment. The example of the configuration definition table shown in FIG. 23 assumes n=4 and m=4. The configuration definition table shown in FIG. 23 forms an amplitude interleaved configuration by the ADC cells 11 and 12, which are the first sub-ADC array, forms an amplitude-interleaved configuration by the ADC cells 31 and 32, which are a third sub-ADC cell array 103, and places other ADC cells in a dormant state. That is, when n=2 and m=1, the configuration definition table of the circuit configuration control unit 110 includes the circuit configuration values, which correspond to when the mode specifying signal MD indicates the third mode, that set the first and second input ranges to the same voltage range and place one of the first and second sampling clocks CLK11 and CLK12 in the dormant state, thereby enabling some of the ADC cells to be in the dormant state.

Note that the above "dormant state" of the ADC cells indicates that the ADC cells have stopped analog-to-digital conversion and have lower power consumption than in the state where performing of the conversion processing is possible. There are various methods for placing the ADC cells in such a dormant state, such as stopping supply of power or clocks to the ADC cells or disconnection of the circuit through which current flows regularly. For example, generally, when the supply of sampling clocks to the ADC cells is stopped, the power consumption of the ADC cells is reduced but cannot be eliminated. Meanwhile, when the power to the ADC cells is blocked to place the ADC cells in the dormant state, it is necessary for the circuit configuration control unit 110 to supply a dormant signal to the ADC cells and switch the ADC cells to the dormant mode.

Figure 24:
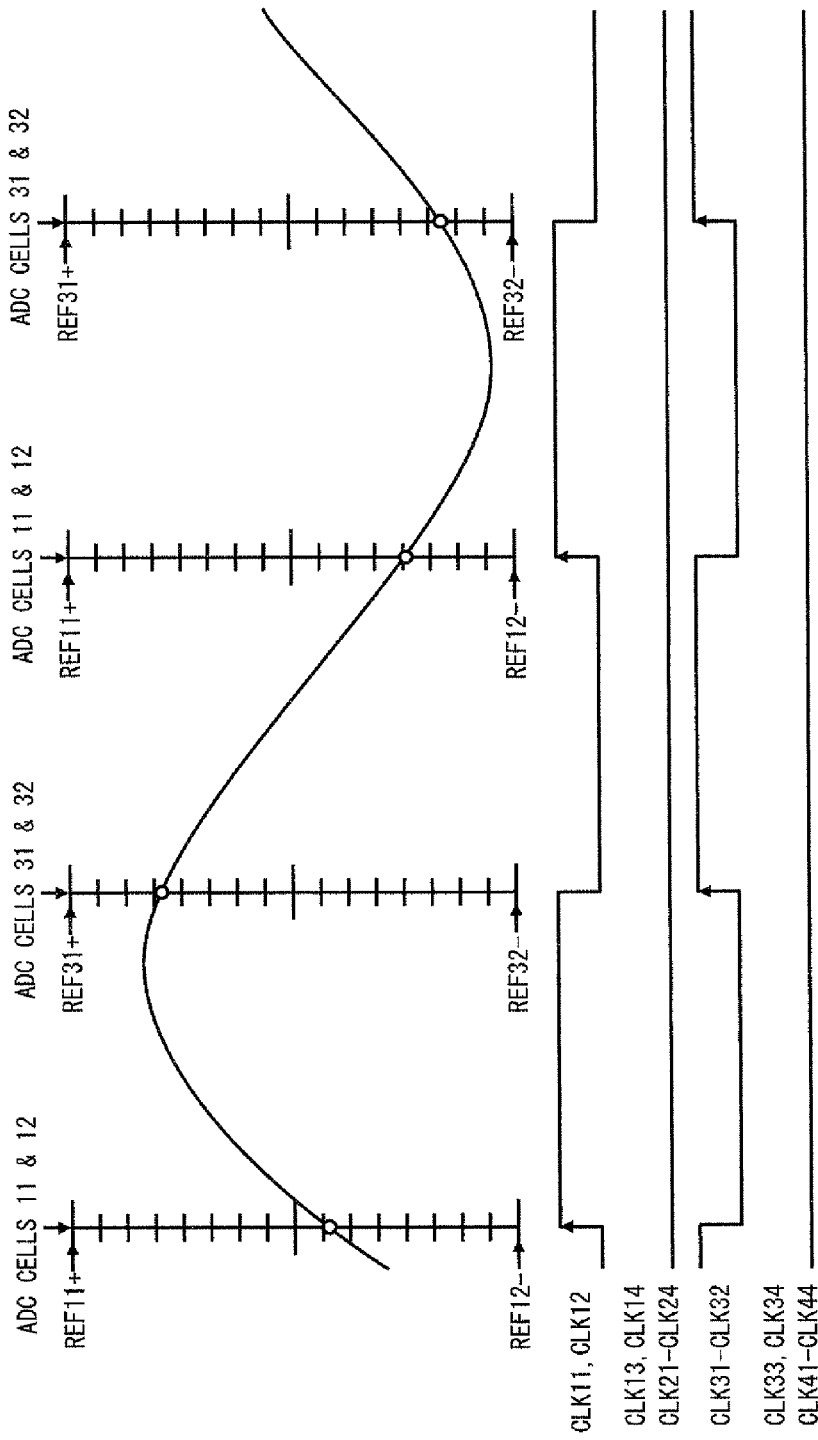
FIG. 24 is a timing chart showing an operation of the analog-to-digital converter according to the fifth exemplary embodiment corresponding to the configuration table shown in FIG. 23.

FIG. 24 is a timing chart showing an operation of the analog-to-digital converter 5 according to the fifth exemplary embodiment based on the configuration definition table shown in FIG. 23. As shown in FIG. 24, the analog-to-digital converter 5 that operates based on the configuration definition table shown in FIG. 23 operates the ADC cells 11 and 12 in the amplitude-interleaved configuration and the ADC cells 31 and 32 in the amplitude-interleaved configuration, to thereby perform the conversion processing with accuracy higher than that in the conversion processing by one ADC cell. At this time, as shown in FIG. 24, the analog-to-digital converter 5 forms the amplitude interleaved configuration by the two ADC cells, thereby having the conversion accuracy equivalent to that of the fifth mode in FIG. 11. Moreover, the analog-to-digital converter 5 that operates based on the configuration definition table shown in FIG. 23 operates the first sub-ADC cell array 101 and the third sub-ADC cell array 103 in the time-interleaved configuration, thereby performing the conversion processing at an operating speed higher than that in the conversion processing by one ADC cell. At this time, as shown in FIG. 24, the analog-to-digital converter 5 forms the amplitude interleaved configuration by the two ADC cells, thereby having the conversion accuracy equivalent to the fifth mode in FIG. 11. That is, the analog-to-digital converter 5 that operates based on the configuration definition table shown in FIG. 23 can achieve operating characteristics equivalent to those of the fifth mode in the graph shown in FIG. 11. Further, when achieving the operating characteristics equivalent to those of the fifth mode, the analog-to-digital converter 5 can reduce the power consumption by placing the unused ADC cells in the dormant state.

As described above, the analog-to-digital converter 5 according to the fifth exemplary embodiment defines the input ranges and operation timings of the ADC cells by the circuit configuration values in the circuit configuration table and sets these definitions according to the operation mode. Hence, the analog-to-digital converter 5 according to the fifth exemplary embodiment can realize the minimal configuration that can achieve the operation characteristics necessary for converting an input analog signal and place the unused ADC cells in the dormant state. That is, the power consumption of the analog-to-digital converter 5 according to the fifth exemplary embodiment can consist only of the power consumed by the ADC cells that are necessary to achieve the required operation performance.

Sixth Exemplary Embodiment

The above exemplary embodiments employ a method for reducing the quantization step voltage or increasing the number of quantization steps by joining the input ranges of the plurality of ADC cells so they become one input range. However, there are various methods for reducing the quantization step voltage or increasing the number of quantization steps other than the above-mentioned method. Therefore, in the sixth exemplary embodiment, a modified example of a method of combining the plurality of ADC cells shall be explained.

FIG. 25 shows a modified example of the configuration table that sets input ranges of the analog-to-digital conversion cells in the analog-to-digital converter according to the present invention. FIG. 25 shows only the values related to the input ranges of the analog-to-digital conversion cells from among the circuit configuration values of the configuration definition table. Moreover, FIG. 25 shows the circuit configuration values of the maximum reference voltages and the minimum reference voltages for first to fifth modified examples. The modified examples which will be explained in the sixth exemplary embodiment include an overlapped range where a part of a first input range and a part of a second input range will be the same voltage range, and further, the first and second input ranges are set so that a step boundary value of the first quantization step and a step boundary value of a second quantization step will be different values. Here, the step boundary value is a value indicating a threshold at which a digital value obtained as a conversion result changes.

First, in the first modified example, a voltage range corresponding to a voltage difference between the power supply voltage VDD and the ground voltage GND shall be an input range of the analog-to-digital converter 2 according to the second exemplary embodiment. The input range of the analog-to-digital converter 2 according to the second exemplary embodiment is realized by a combination of the ADC cells 11 to 14. In the first modified example, each of the ADC cells 11 to 14 has an input range corresponding to the voltage difference between the power supply voltage VDD and the ground voltage GND, and absolute values of the input ranges are set to differ by one LSB from each other. Note that the quantization step voltage of one LSB in the first modified example is set to the size obtained by dividing the input range realized by the combination of the ADC cells 11 to 14 (e.g., the power supply voltage VDD) by the number of quantization steps 32, which will be (VDD/32).

Figure 26:
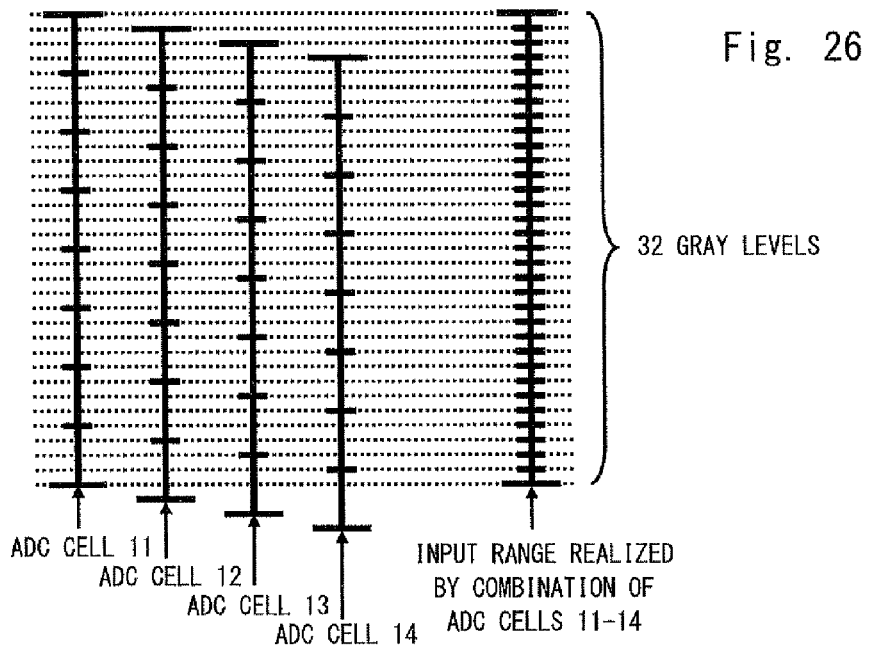
FIG. 26 is a schematic diagram of input ranges realized by a first modified example shown in FIG. 25.

FIG. 26 shows a relationship between the input ranges of the respective ADC cells 11 to 14 that are set based on such circuit configuration values as described above and the input range of the analog-to-digital converter 2 realized by the combination of the ADC cells 11 to 14. As shown in FIG. 26, the ADC cells 11 to 14 that are set based on the first modified example have eight levels of the number of quantization steps and the quantization step voltage of VDD/8. However, as the absolute values of the input ranges of the ADC cells 11 to 14 are set to differ by one LSB from each other, the quantization step voltages between the ADC cells are set to complement each other. Further, the input range of the analog-to-digital converter 2 according to the second exemplary embodiment has 32 levels of the number of quantization steps and the quantization step voltage of VDD/32.

Next, in the second modified example, a voltage range corresponding to the voltage difference between the power supply voltage VDD and the ground voltage GND shall be the input range of the analog-to-digital converter 2 according to the second exemplary embodiment. The input range of the analog-to-digital converter 2 according to the second exemplary embodiment is realized by the combination of the ADC cells 11 to 14. In the second modified example, each of the ADC cells 11 to 14 has a voltage range which is half of that of the power supply voltage VDD. That is, in the second modified example, each of the ADC cells 11 to 14 has a quantization step voltage of VDD/16. The ADC cells 11 and 12 perform the conversion processing for an upper half of the input range of the analog-to-digital converter 2, and the ADC cells 13 and 14 perform the conversion processing for a lower half of the input range of the analog-to-digital converter 2. Moreover, in the second modified example, the absolute value of the input range of the ADC cell 11 and the absolute value of the input range of the ADC cell 12 are set to differ by one LSB from each other, and the absolute value of the input range of the ADC cell 13 and the absolute value of the input range of the ADC cell 14 are set to differ by one LSB from each other. Note that the one LSB of the quantization step voltage in the second modified example is set to a size that is obtained by dividing the input voltage realized by the combination of the ADC cells 11 to 14 (e.g., the power supply voltage) by the number of quantization steps 32, which will be (VDD/32).

Figure 27:
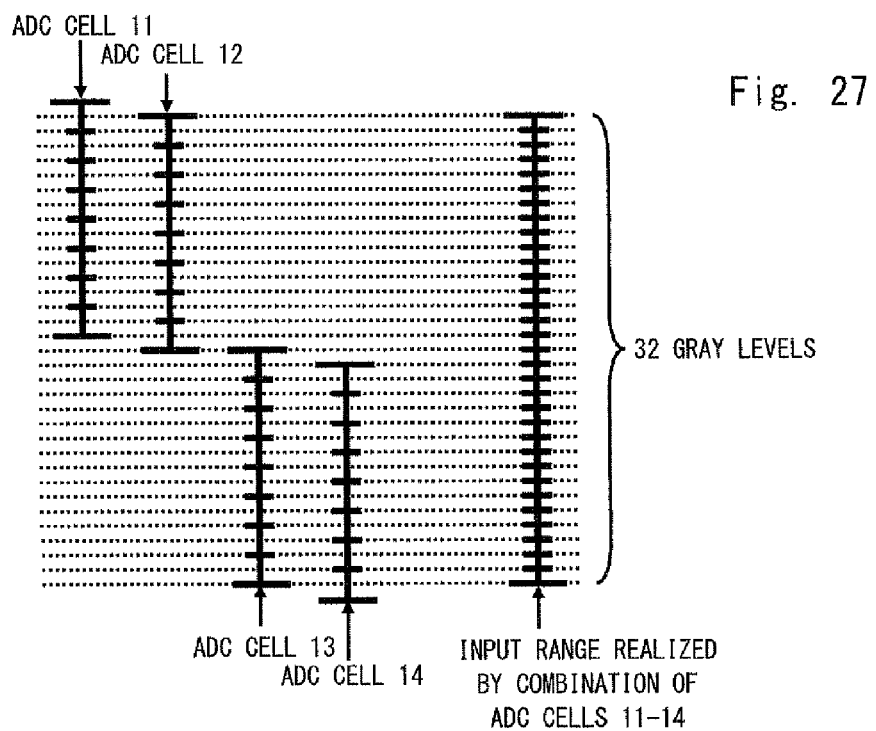
FIG. 27 is a schematic diagram of input ranges realized by a second modified example shown in FIG. 25.

FIG. 27 shows a relationship between the input ranges of the respective ADC cells 11 to 14 that are set based on such circuit configuration values and the input range of the analog-to-digital converter 2 realized by the combination of the ADC cells 11 to 14. As shown in FIG. 27, the ADC cells 11 to 14 that are set based on the second modified example have eight levels of the number of quantization steps and the quantization step voltage of VDD/16. However, as the absolute values of the input ranges of the ADC cells 11 and 12 are set to differ by one LSB, and the absolute values of the input ranges of the ADC cells 13 and 14 are set to differ by one LSB, the quantization step voltages between the ADC cells are set to complement each other. Moreover, the ADC cells 11 and 12 are in charge of performing the conversion processing for the upper half of the input range of the analog-to-digital converter 2, and the ADC cells 13 and 14 are in charge of performing the conversion processing for the lower half of the input range of the analog-to-digital converter 2. Thus, the input range of the analog-to-digital converter 2 according to the second exemplary embodiment has 32 levels of the number of quantization steps and VDD/32 of the quantization step voltage.

In the first and second modified examples, the absolute values of the input ranges are set so that the input ranges of the plurality of ADC cells are overlapped, and the quantization step voltages of the plurality of ADC cells are complement each other. Hence, it is possible to reduce the quantization step voltage of the digital values obtained by the analog-to-digital converter 2, while increasing the quantization step voltages of the plurality of ADC cells. Increasing the quantization step voltages for the respective ADC cells enables a reduction in an input offset of a comparator that evaluates a size relationship between a signal level of an analog signal and a reference voltage in the ADC cell and a reduction in influences on the digital value, such as noise generated inside the ADC cells.

Next, the third to fifth modified examples shall be explained. In the first and second modified examples, the input range of the analog-to-digital converter 2 is quantized equally, however in the third to fifth modified examples, the input range of the analog-to-digital converter 2 is quantized unequally.

In the third modified example, the voltage range corresponding to the voltage difference between the power supply voltage VDD and the ground voltage GND shall be the input voltage of the analog-to-digital converter 2 according to the second exemplary embodiment. The input range of the analog-to-digital converter 2 according to the second exemplary embodiment is realized by the combination of the ADC cells 11 to 14. In the third modified example, each of the ADC cells 11 and 14 has a voltage range of a third of the power supply voltage VDD, and each of the ADC cells 12 and 13 has a voltage range of ⅙ of the power supply voltage VDD. That is, in the third modified example, each of the ADC cells 11 and 14 has a quantization step voltage of VDD/24, and each of the ADC cells 12 and 13 has a quantization step voltage of VDD/48. That is, in the third modified example, the minimum quantization step voltage is set to VDD/48. Then, the ADC cell 11 performs the conversion processing for a upper third of the input range of the analog-to-digital converter 2, the ADC cells 12 and 13 perform the conversion processing for a middle third of the input range of the analog-to-digital converter 2, and the ADC cell 14 performs the conversion processing for a lower third of the input range of the analog-to-digital converter 2. Moreover, the ADC cell 12 performs the conversion processing for an upper half of the middle third of the input range of the analog-to-digital converter 2, and the ADC 13 performs the conversion processing for a lower half of the middle third of the input range of the analog-to-digital converter 2.

Figure 28:
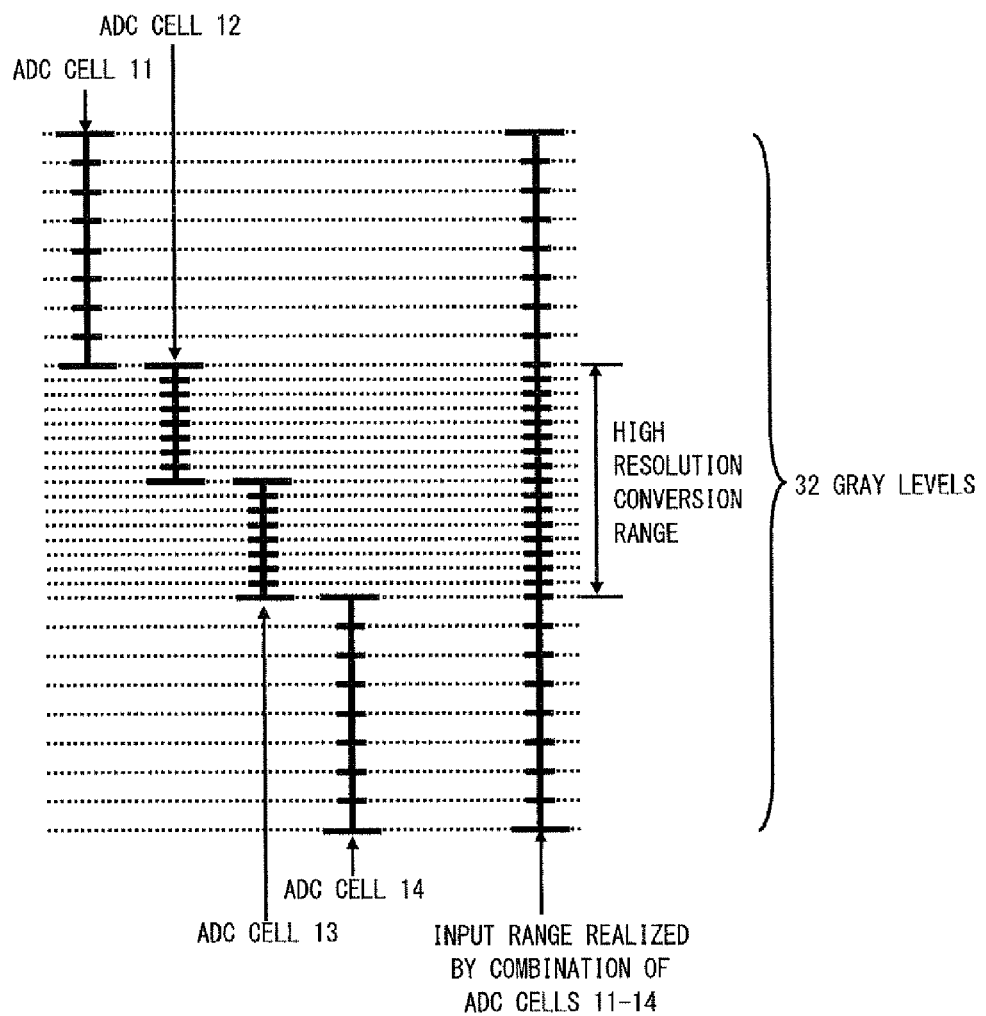
FIG. 28 is a schematic diagram of input ranges realized by a third modified example shown in FIG. 25.

FIG. 28 shows a relationship between the input ranges of the respective ADC cells 11 to 14 that are set based on such circuit configuration values and the input range of the analog-to-digital converter 2 realized by the combination of the ADC cells 11 to 14. As shown in FIG. 28, the ADC cells 11 to 14 that are set based on the third modified example each have eight levels of the number of quantization steps, the quantization step voltages of the ADC cells 11 and 14 are set to VDD/24, and the quantization step voltages of the ADC cells 12 and 13 are set to VDD/48. Further, different voltage ranges in the input range of the analog-to-digital converter 2 are assigned as the input ranges of the ADC cells 11 to 14. Hence, the analog-to-digital converter 2 according to the second exemplary embodiment can set small quantization step voltages in a part of the input range while having 32 levels of the number of quantization steps as a whole.

Next, the fourth modified example shall be explained. In the fourth modified example, the voltage range corresponding to the voltage difference between the power supply voltage VDD and the ground voltage GND shall be the input voltage of the analog-to-digital converter 2 according to the second exemplary embodiment. The input range of the analog-to-digital converter 2 according to the second exemplary embodiment is realized by the combination of the ADC cells 11 to 14. In the fourth modified example, the input ranges are set so that parts of the input ranges of the ADC cells 11 and 12 are overlapped. Moreover, in the fourth modified example, in the overlapped input range, the quantization step voltage of the ADC cell 11 and the quantization step voltage of the ADC cell 12 are set to complement each other. Here, in the fourth modified example, the minimum quantization step voltage (LSB) shall be VDD/25. The maximum reference voltage of the ADC cell 11 is set to VDD, the minimum reference voltage is set to GND+9LSB, the maximum reference voltage of the ADC cell 12 is set to VDD−9LSB, and the minimum reference voltage is set to GND. Therefore, in the input range of the analog-to-digital converter 2 that is set based on the fourth setting example, nine levels in the middle part of the input range have VDD/25 of the quantization step voltage, and the input ranges above and below the nine levels have 2VDD/25 of the quantization step width and the numbers of levels thereof is four. That is, in the fourth setting example, the input range of the analog-to-digital converter 2 is divided unequally into 17 levels.

Figure 29:
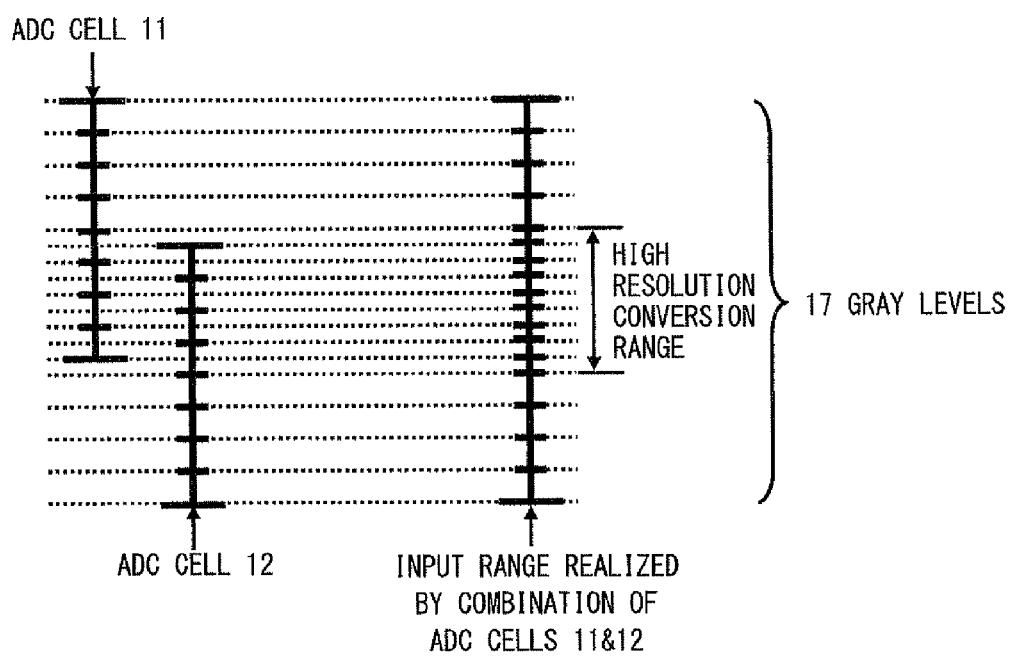
FIG. 29 is a schematic diagram of input ranges realized by a fourth modified example shown in FIG. 25.

FIG. 29 shows a relationship between the input ranges of the respective ADC cells 11 and 12 that are set based on such circuit configuration values and the input range of the analog-to-digital converter 2 realized by the combination of the ADC cells 11 and 12. As shown in FIG. 29, in the input range of the analog-to-digital converter 2 that is set based on the fourth setting example, nine levels in the middle part of the input range have VDD/25 of the quantization step voltage, and the input ranges above and below the nine levels have 2VDD/25 of the quantization step width and the numbers of levels thereof is four. Hence, the analog-to-digital converter 2 according to the second exemplary embodiment can set small quantization step voltages in a part of the input range while having 17 levels of the number of quantization steps as a whole.

Next, the fifth modified example shall be explained. In the fifth modified example, the voltage range corresponding to the voltage difference between the power supply voltage VDD and the ground voltage GND shall be the input voltage of the analog-to-digital converter 2 according to the second exemplary embodiment. The input range of the analog-to-digital converter 2 according to the second exemplary embodiment is realized by the combination of the ADC cells 11 to 14. Here, in the fifth modified example, the input ranges are set so that parts of the input ranges of the ADC cells 11 and 12 are overlapped and parts of the input ranges of the ADC cells 13 and 14 are overlapped. Further, in the fifth modified example, the ADC cells 11 and 12 perform the conversion processing for the upper half of the input range of the analog-to-digital converter 2, and the ADC cells 13 and 14 perform the conversion processing for the lower half of the input range of the analog-to-digital converter 2. Furthermore, in the fifth modified example, in the overlapped input range, the quantization step voltages of the ADC cells 11 and 12 are set to complement each other, and the quantization step voltages of the ADC cells 13 and 14 are set to complement each other. Here, in the fourth modified example, the minimum quantization step voltage (LSB) shall be VDD/48, and further, the entire number of quantization steps shall be 32 levels.

Figure 30:
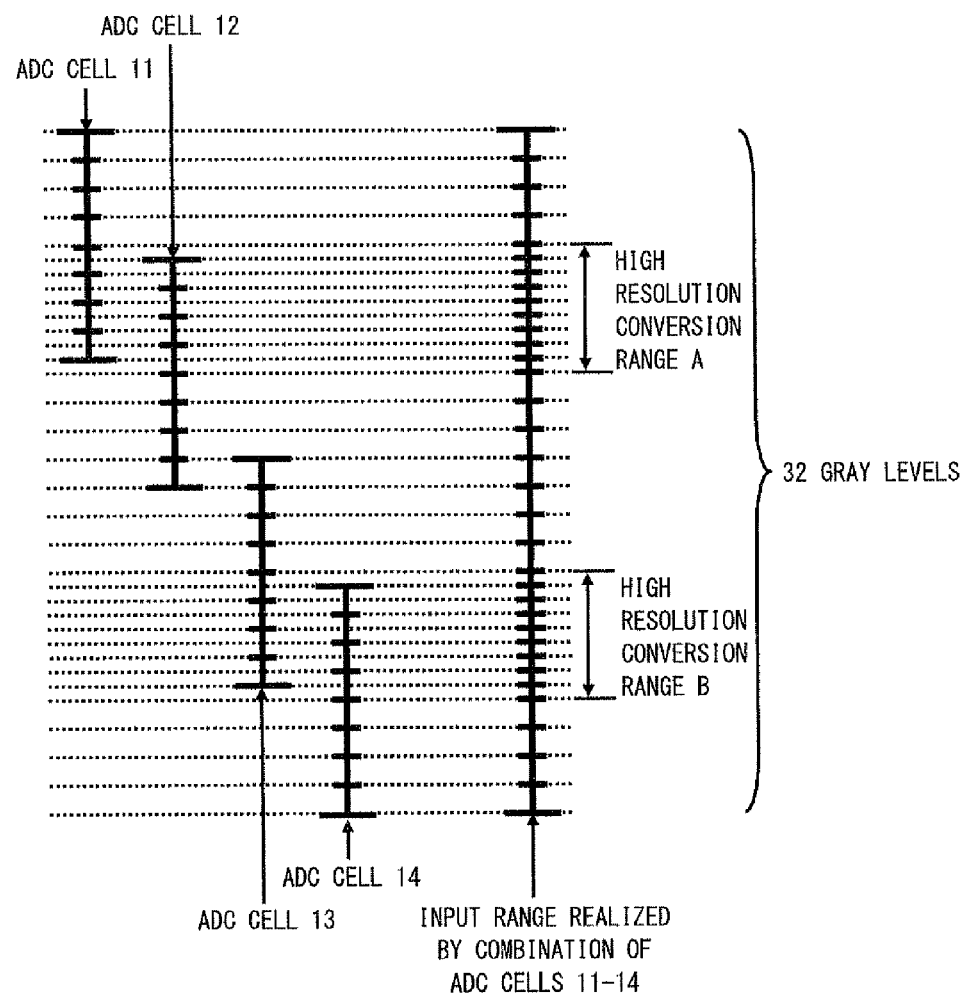
FIG. 30 is a schematic diagram of input ranges realized by a fifth modified example shown in FIG. 25.

FIG. 30 shows a relationship between the input ranges of the respective ADC cells 11 to 14 that are set based on such circuit configuration values and the input range of the analog-to-digital converter 2 realized by the combination of the ADC cells 11 to 14. As shown in FIG. 30, in the input range of the analog-to-digital converter 2 that is set based on the fifth setting example, regions where the quantization step voltage will be VDD/48 are set to two parts of the input ranges. That is, the analog-to-digital converter 2 according to the second exemplary embodiment can set a small quantization step voltage in a plurality of ranges of the input ranges while having 32 levels of the number of quantization steps as a whole.

By setting unequal intervals between the quantization step voltages based on the circuit configuration values of the third to fifth modified examples, it is possible to achieve a quantization step voltage that is smaller than the quantization step voltage obtained by dividing the power supply voltage by the total number of the quantization steps of the plurality of ADC cells having the same number of quantization steps.

As shown in the examples shown in FIGS. 28 to 30, setting unequal sampling accuracy (e.g., the quantization step voltage) in the amplitude direction produces an effect of quantizing only important components with high accuracy using ADC cells having poor performance in the signal processing. In a communications system, important information for the signal processing in the information included in signals may be unevenly distributed. In such a case, when all the input ranges are processed with the conversion accuracy for the important information, it is necessary to improve the performance of all the plurality of ADC cells, thereby causing a problem that the circuit size increases. However, by converting only the important parts with high accuracy, it is possible to simplify the configurations of the plurality of ADC cells and thus reduce the circuit size. Moreover, the reduction in the circuit size leads to a reduction in the power consumption.

Seventh Exemplary Embodiment

In the seventh exemplary embodiment, a modified example of a method for controlling sampling timings shall be explained. More particularly, in this modified example, circuit configuration values having unequal sampling intervals to thereby vary the sampling accuracy in the time-axis direction will be explained.

FIG. 31 shows an example of the circuit configuration values that set unequal sampling intervals. The example shown in FIG. 31 is an example in which the sampling clock generation unit 112 generates an eight-phase sampling clock and selects the first to fourth sampling clocks CLK11 to CLK14 from the eight-phase sampling clock. As shown in FIG. 31, in these circuit configuration values, the size of the input range of the ADC cells 11 to 14 shall be the voltage difference between the power supply voltage VDD and ground voltage GND. Further, the circuit configuration values specify: 0 deg clock is selected as the first sampling clock CLK11; −90 deg clock is selected as the second sampling clock CLK12; −135 deg clock is selected as the third sampling clock CLK13; and −315 deg clock is selected as the fourth sampling clock CLK14.

Figure 32:
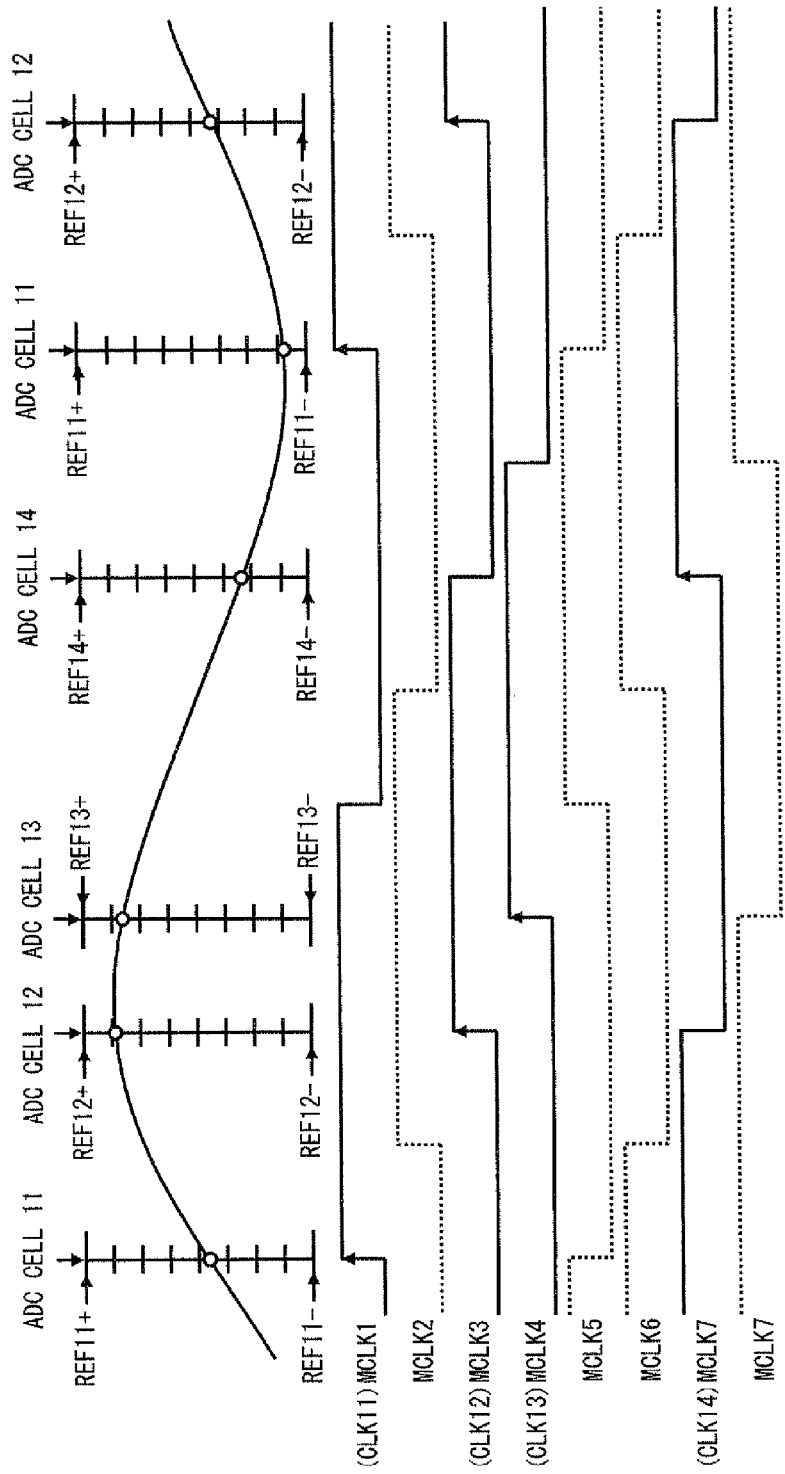
FIG. 32 is a timing chart showing an operation of an analog-to-digital converter of the present invention corresponding to the configuration table shown in FIG. 31.

FIG. 32 is a timing chart showing an operation of the analog-to-digital converter 2 based on the circuit configuration values shown in FIG. 31. As shown in FIG. 32, in the analog-to-digital converter 2 that operates based on the circuit configuration values of FIG. 31, when the sampling clock generation unit 112 outputs clocks having different phases from among a multiple-phase clock as the first sampling clock CLK11 and the second sampling clock CLK12, the sampling clock generation unit 112 selects the clocks which will be the first to fourth sampling clocks CLK11 to CLK14 from the multiple-phase clock so that the sampling timings of the ADC cells 11 to 14 will be unequal. In the region with close sampling intervals, the resolution in the time-axis direction can be high, whereas in the region with distant sampling intervals, the resolution in the time-axis direction can be low.

Note that in FIG. 32, an example of performing a sampling operation using four ADC cells is explained. However an operation at unequal sampling intervals can be realized by using only two ADC cells. In such a case, when clocks having different phases from among the multiple-phase clock are output as the first and second sampling clocks, the sampling clock generation unit 112 selects the clocks from the multiple-phase clock as the first and second sampling clocks so that the sampling timings of the first and second analog-to-digital conversion cells will be unequal.

Next, another modified example that varies the sampling accuracy in the time-axis direction shall be explained. In the above explanation, an example in which all of the ADC cells 11 to 14 have the same number of quantization steps (bit accuracy) has been explained. However in the modified example explained below, the ADC cells 11 and 14 and the ADC cells 12 and 13 have different numbers of quantization steps. More specifically, the ADC cells 11 and 14 have the number of quantization steps of 3-bit accuracy (eight levels), and the ADC cells 12 and 13 have the number of quantization steps of 4-bit accuracy (16 levels).

Figure 33:
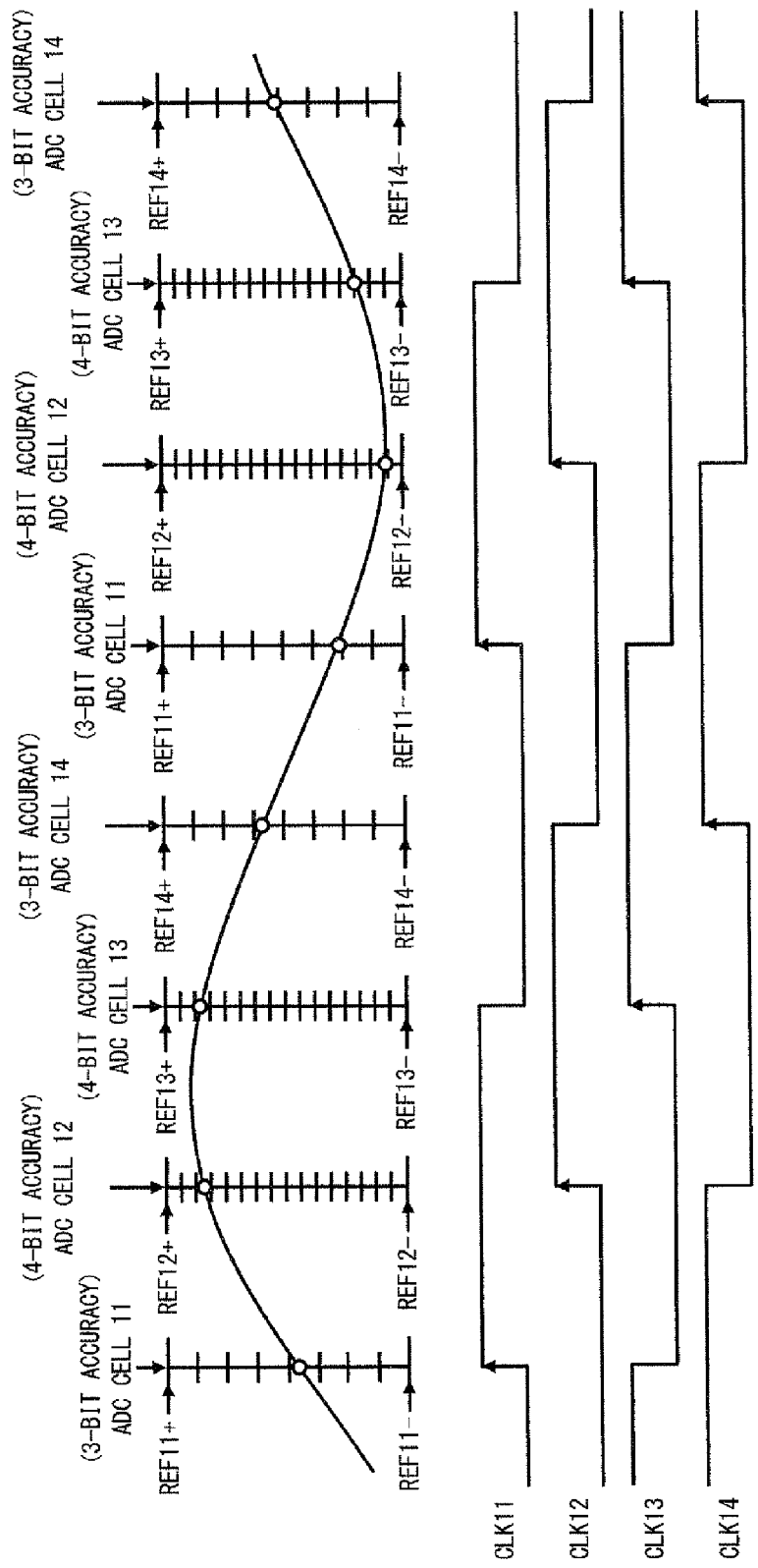
FIG. 33 is a timing chart showing an operation of an analog-to-digital converter of the present invention that performs conversion processing with unequal degrees of conversion accuracy.
Figure 34:
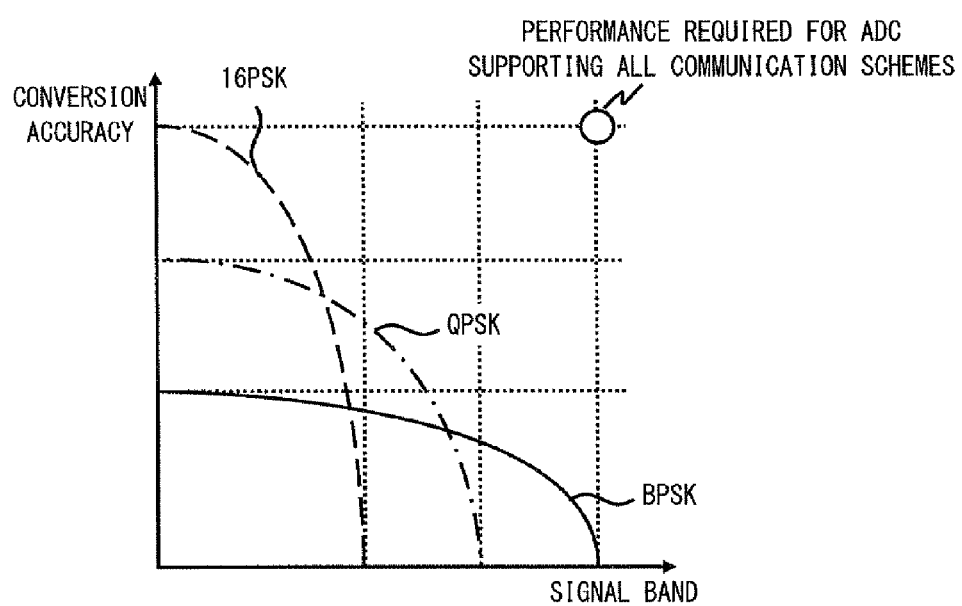
FIG. 34 is a graph showing a relationship between a conversion speed and conversion accuracy required for an analog-to-digital converter.

FIG. 33 is a timing chart showing an operation in the first mode of the analog-to-digital converter 2 according to another modified example. As shown in FIG. 33, the analog-to-digital converter 2 according to this modified example outputs digital values quantized by the number of quantization steps that differ from sampling timing to sampling timing.

As in the examples shown in FIGS. 32 and 33, unequal sampling accuracy in the time-axis direction (the quantization timing or the quantization step voltage) produces an effect that makes it possible to quantize only the important components with high accuracy using ADC cells having poor performance in the signal processing. In a communications system, important information for the signal processing in the information included in signals may be unevenly distributed. In such a case, when all the input ranges are processed with the conversion accuracy for the important information, it is necessary to improve the performance of all the plurality of ADC cells, thereby causing a problem that the circuit size increases. However, by converting only the important parts with high accuracy, it is possible to simplify the configurations of the plurality of ADC cells and thus reduce the circuit size. Moreover, the reduction in the circuit size leads to reduction in the power consumption.

Note that the ADC cells with different degrees of conversion accuracy can realize the setting example of the input range in the second mode shown in FIG. 28 by using three ADC cells. For example, the input range shown in FIG. 28 can be realized by using the three ADC cells 11, 12, and 14 and placing the ADC cell 13 in the dormant state.

The present invention has been explained so far with reference to the exemplary embodiments, however the present invention is not limited by the above. Various modifications obvious to a person skilled in the art can be made to the configuration and details of the present invention within the scope of the invention.

The present application claims priority rights of and is based on Japanese Patent Application No. 2011-216427 filed on Sep. 30, 2011 in the Japanese Patent Office, the entire contents of which are hereby incorporated by reference.

Reference Signs List
1-5 ANALOG-TO-DIGITAL CONVERTER
11, 12, and 13, 1*n* ADC CELL
11*p*, 12*p*, and 13*p*, 1*np* PREPROCESSING CIRCUIT
11*a*, 12*a*, and 13*a*, 1*na* ADC CELL
21, 22, and 23, 2*n* ADC CELL
m1, m2, m3, and mn ADC CELL
101, 102, and 10*m* SUB-ADC CELL ARRAY
110 CIRCUIT CONFIGURATION CONTROL UNIT
111, 116 ADC CELL CONTROL UNIT
112 SAMPLING CLOCK GENERATION UNIT
113 OUTPUT DATA PROCESSING CIRCUIT
114 OUTPUT DATA ANALYSIS UNIT
115 CALIBRATION SIGNAL GENERATION CIRCUIT

The invention claimed is:

1. An analog-to-digital converter comprising:
a first analog-to-digital conversion cell that quantizes a voltage level of an analog signal within a first input range at a first quantization step and outputs a first digital value;
a second analog-to-digital conversion cell that quantizes the voltage level of the analog signal within a second input range at a second quantization step and outputs a second digital value;
a configuration controller which, when a mode specifying signal indicates a first mode, generates a control signal that sets the first and second input ranges to the same voltage range and sets first and second sampling clocks to different phases, and when the mode specifying signal indicates a second mode, generates the control signal that sets the first and second input ranges to one continuous voltage range and sets the first and second sampling clocks to the same phase;
an ADC cell controller which individually controls an upper limit value and a lower limit value of the first input range and an upper limit value and a lower limit value of the second input range according to the control signal;
a sampling clock generator which supplies the first and second sampling clocks to the first and second analog-to-digital conversion cells, respectively, according to the control signal; and
an output data processing circuit that merges the first and second digital values and outputs output data.

2. The analog-to-digital converter of claim 1., wherein the ADC cell controller outputs a first maximum reference voltage that sets a maximum value of the first input range, a first minimum reference voltage that sets a minimum value of the first input range, a second maximum reference voltage that sets a maximum value of the second input range, and a second minimum reference voltage that sets a minimum value of the second input range, and switches voltage values of the first and second maximum reference voltages and voltage values of the first and second minimum reference voltages according to the control signal.

3. The analog-to-digital converter according to claim 1, further comprising a preprocessing circuit that converts an amplitude of the analog signal to be in a voltage range convertable by the first and second analog-to-digital conversion cells and generates an intermediate analog signal.

4. The analog-to-digital converter according to claim 3, wherein the preprocessing circuit outputs a first conversion input signal obtained by level-shifting a signal level of the intermediate analog signal by a first shift amount according to the voltage range of the first input range and a second conversion input signal obtained by level-shifting the signal level of the intermediate analog signal by a second shift amount according to the voltage range of the second input range, outputs the first conversion input signal to the first analog-to-digital conversion cell, and outputs the second conversion input signal to the second analog-to-digital conversion cell.

5. The analog-to-digital converter according to claim 4, wherein the ADC cell controller varies a size of each of the first and second shift amounts according to the control signal.

6. The analog-to-digital converter according to claim 5, wherein the ADC cell controller changes an amplification factor of the preprocessing circuit according to the control signal.

7. The analog-to-digital converter according to claim 1, wherein when the control signal that is output corresponding to the first mode is input, the output data processing circuit outputs the first digital value and the second digital value as output data, and when the control signal that is output corresponding to the second mode is input, the output data processing circuit outputs data that is obtained by merging the first and second digital values according to a conversion table as the output data.

8. The analog-to-digital converter according to claim 1, wherein when the mode specifying signal indicates a third mode, the configuration controller outputs the control signal that sets the first and second input ranges to the same voltage range and places one of the first and second sampling clocks in a dormant state.

9. The analog-to-digital converter according to claim 1, further comprising:
an output data analysis unit that analyzes a size of an error between the digital values output by the first and second analog-to-digital conversion cells and an ideal value; and
a calibration signal generation circuit that generates a calibration signal, wherein
when the mode specifying signal indicates a fourth mode, the configuration controller outputs the control signal for instructing one of the first and second analog-to-digital conversion cells to perform conversion processing on the analog signal and the other one of the first and second analog-to-digital conversion cells to perform conversion processing on the calibration signal,
the output data analysis unit generates a correction value for correcting a deviation between a digital value that is obtained by converting the calibration signal from the output data processing unit based on the control signal that is output corresponding to the fourth mode and an ideal value of the digital value and supplies the correction value to the ADC cell controller,
the ADC cell controller corrects at least one of the voltage ranges of the first and second input voltages and an input offset voltage of the analog-to-digital conversion cell based on the correction value.

10. The analog-to-digital converter according to claim 1, wherein when the first and second input ranges are set based on the control signal that is output corresponding to the second mode, the ADC cell controller sets the first and second input ranges so that the first input range and the second input range will have an overlapped range where a part of the first input range and a part of the second input range will be the same voltage range, and further, a step boundary value of the first quantization step and a step boundary value of the second quantization step will be different values.

11. The analog-to-digital converter according to claim 1, wherein a step width of the first quantization step and a step width of the second quantization step are set different values.

12. The analog-to-digital converter according to claim 1, wherein the first quantization step and the second quantization step are different.

13. The analog-to-digital converter according to claim 1, wherein the sampling clock generator selects whether to output clocks having different phases from among a multiple-phase clock as the first and second sampling clocks or to output one clock selected from the multi-phase clock as the first and second sampling clocks.

14. The analog-to-digital converter according to claim 13, wherein when the clocks having different phases from among the multi-phase clock are output as the first and second sampling clocks, the sampling clock generator selects clocks which will be the first and second sampling clocks from the multi-phase clock so that an interval between a first sampling timing, which is a sampling timing of the first analog-to-digital conversion cell, and a second sampling timing, which is a sampling timing of the second analog-to-digital conversion cell, will be different from an interval between the second sampling timing and the first sampling timing.

15. The analog-to-digital converter according to claim 1, further comprising:
a third analog-to-digital conversion cell that quantizes a voltage level of the analog signal within a third input range at a third quantization step and outputs a third digital value; and
a fourth analog-to-digital conversion cell that quantizes a voltage level of the analog signal within a fourth input range at a fourth quantization step and outputs a fourth digital value, wherein
the sampling clock generator further outputs third and fourth sampling clocks which will be supplied to the third and fourth analog-to-digital conversion cells, respectively, and
the configuration controller,
when the mode specifying signal indicates the first mode, outputs the control signal that sets the first to fourth input ranges to the same voltage range, and further, sets the first to fourth sampling clocks to different phases,
when the mode specifying signal indicates the second mode, outputs the control signal that sets the first to fourth input ranges to one continuous voltage range, and further, sets the first to fourth sampling clocks to the same phase, and
when the mode specifying signal indicates a fifth mode, outputs the control signal that sets the first and second input ranges to one continuous voltage range, sets the third and fourth input voltages to one continuous voltage range, sets a first sampling clock group including the first and second sampling clocks having the same phase and a second sampling clock group including the third and fourth sampling clocks having another same phase to different phases.

16. The analog-to-digital converter according to claim 1, further comprising:
a conversion cell array that is composed of a plurality of analog-to-digital conversion cells having a function equivalent to that of the first and second analog-to-digital conversion cells,
wherein the configuration controller outputs the control signal that instructs any one of the plurality of analog-to-digital conversion cells to perform an operation corresponding to the first and second modes.

17. A method for analog-to-digital conversion, the method comprising
quantizing a voltage level of an analog signal within a first input range at a first quantization step and outputting a first digital value;

quantizing the voltage level of the analog signal within a second input range at a second quantization step and outputting a second digital value;

individually controlling an upper limit value and a lower limit value of the first input range and an upper limit value and a lower limit value of the second input range according to a control signal;

when a mode specifying signal indicates a first mode, using a first analog-to-digital conversion cell having the first input range and a second analog-to-digital conversion cell having the second input range, setting the first and second input ranges to the same voltage range, quantizing the voltage level of the analog signal, and outputting the first digital value and the second digital value at different sampling timings;

when the mode specifying signal indicates a second mode, using the first analog-to-digital conversion cell and the second analog-to-digital conversion cell, setting the first and second input ranges to one continuous voltage range, and outputting the first digital value and the second digital value at the same sampling timing; and merging the first and second digital values and outputting output data.

* * * * *